(12) United States Patent
Toda

(10) Patent No.: US 10,284,758 B2
(45) Date of Patent: May 7, 2019

(54) LIGHT RECEIVING AND EMITTING DEVICE

(71) Applicant: SONY CORPORATION, Tokyo (JP)

(72) Inventor: Atsushi Toda, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 174 days.

(21) Appl. No.: 14/764,831

(22) PCT Filed: Feb. 3, 2014

(86) PCT No.: PCT/JP2014/052396
§ 371 (c)(1),
(2) Date: Jul. 30, 2015

(87) PCT Pub. No.: WO2014/125945
PCT Pub. Date: Aug. 21, 2014

(65) Prior Publication Data
US 2015/0373243 A1    Dec. 24, 2015

(30) Foreign Application Priority Data

Feb. 13, 2013   (JP) ................................ 2013-025184

(51) Int. Cl.
*H04N 5/225*    (2006.01)
*H01L 27/15*    (2006.01)
(Continued)

(52) U.S. Cl.
CPC ....... *H04N 5/2256* (2013.01); *H01L 27/1464* (2013.01); *H01L 27/14612* (2013.01);
(Continued)

(58) Field of Classification Search
CPC ........... H04N 5/374–5/37457; H04N 1/00315; H04N 1/00103–1/00108;
(Continued)

(56) References Cited

U.S. PATENT DOCUMENTS

| | | | |
|---|---|---|---|
| 2004/0132228 A1* | 7/2004 | Magno | C23C 14/12 438/99 |
| 2008/0100735 A1* | 5/2008 | Jeon | H04N 5/23293 348/308 |

(Continued)

FOREIGN PATENT DOCUMENTS

| | | |
|---|---|---|
| JP | 09-198001 A | 7/1997 |
| JP | 10-307237 A | 11/1998 |

(Continued)

*Primary Examiner* — Xi Wang
(74) *Attorney, Agent, or Firm* — Chip Law Group

(57) ABSTRACT

There is provided a light receiving and emitting device including: a light receiving and emitting unit configured to have a plurality of pixels that receive light and perform photoelectric conversion through which an electric signal corresponding to an amount of the light is output and a plurality of light emitting units that emit light, the two or more light emitting units being disposed for every two or more pixels; an imaging optical system configured to form an image on the pixels of the light receiving and emitting unit; and a control unit configured to independently control light emission of the plurality of respective light emitting units.

18 Claims, 28 Drawing Sheets

(51) Int. Cl.
*H01L 27/146* (2006.01)
*H04N 5/369* (2011.01)
*H04N 5/378* (2011.01)
*H01L 33/30* (2010.01)
*H01S 5/42* (2006.01)

(52) U.S. Cl.
CPC .. *H01L 27/14621* (2013.01); *H01L 27/14625* (2013.01); *H01L 27/14627* (2013.01); *H01L 27/14685* (2013.01); *H01L 27/156* (2013.01); *H04N 5/3696* (2013.01); *H04N 5/378* (2013.01); *H01L 33/30* (2013.01); *H01S 5/423* (2013.01); *H04N 2005/2255* (2013.01)

(58) Field of Classification Search
CPC ............. H01L 27/14643–27/14663; H01L 27/146–27/14893; G08B 13/1966
USPC ....... 348/308; 250/208.1; 257/225–234, 257, 257/258, 291–294, 431–448, 431–44

See application file for complete search history.

(56) References Cited

U.S. PATENT DOCUMENTS

| | | | |
|---|---|---|---|
| 2008/0143824 A1* | 6/2008 | Kuroki | H04N 13/02 348/47 |
| 2010/0254692 A1* | 10/2010 | Kurt | G03B 15/03 396/155 |
| 2011/0215302 A1* | 9/2011 | Lhee | H01L 27/3211 257/40 |
| 2011/0243512 A1* | 10/2011 | Takai | G02B 6/4246 385/92 |
| 2012/0050694 A1* | 3/2012 | Huang | G03B 21/2033 353/38 |
| 2013/0019461 A1 | 1/2013 | Rudmann et al. | |
| 2013/0105823 A1* | 5/2013 | Kurokawa | H01L 27/14623 257/84 |
| 2014/0183269 A1* | 7/2014 | Glaser | G06F 21/32 235/492 |
| 2014/0198215 A1* | 7/2014 | Schumm | H04N 7/181 348/159 |

FOREIGN PATENT DOCUMENTS

| | | |
|---|---|---|
| JP | 2005-116709 A | 4/2005 |
| JP | 2009-005082 A | 1/2009 |

\* cited by examiner

LIGHT RECEIVING AND EMITTING DEVICE

TECHNICAL FIELD

The present technology relates to a light receiving and emitting device, and particularly to a light receiving and emitting device designed to be capable of, for example, both capturing images and radiating light to a desired position with a compact configuration.

BACKGROUND ART

For example, Patent Literature 1 discloses a technology in which signals according to light reception states of respective elements of an element group in which they are arrayed in a two-dimensional shape having functions of both light emission and light reception are sequentially read in a reading period that is set in advance, and on the other hand, the respective elements of the element group are caused to sequentially emit light at display signals of voltages according to video signals transmitted from a partner in a display period that deviates from the reading period.

CITATION LIST

Patent Literature

Patent Literature 1: JP H9-198001A

SUMMARY OF INVENTION

Technical Problem

In the technology of Patent Literature 1, however, since there is no imaging optical system such as an imaging lens or the like for making images, it is difficult to capture an image of a subject, and thus difficult to obtain information of a detailed position, shape, and the like of the subject.

In addition, in the technology of Patent Literature 1, the respective elements of the element group are only caused to sequentially emit light at the display signals of the voltages according to the video signals, and thus it is difficult to radiate light only to a desired position.

The present technology has been accomplished taking the above circumstances into consideration, and aims to enable both capturing of images and radiation of light to a desired position to be performed with a compact configuration.

Solution to Problem

According to the present technology, there is provided a light receiving and emitting device including: a light receiving and emitting unit configured to have a plurality of pixels that receive light and perform photoelectric conversion through which an electric signal corresponding to an amount of the light is output and a plurality of light emitting units that emit light, the two or more light emitting units being disposed for every two or more pixels; an imaging optical system configured to form an image on the pixels of the light receiving and emitting unit; and a control unit configured to independently control light emission of the plurality of respective light emitting units.

In the light receiving and emitting device of the present technology, in the light receiving and emitting unit which has a plurality of pixels which receive light and perform photoelectric conversion through which an electric signal corresponding to the amount of light is output and a plurality of light emitting units which emit light, 2 or more light emitting units are disposed for every 2 or more pixels. In addition, in the imaging optical system, an image is formed on the pixels of the light receiving and emitting unit. Furthermore, light emission of the plurality of respective light emitting units is controlled independently.

The light receiving and emitting device may be an independent device, or an internal block constituting one device.

Advantageous Effects of Invention

According to the present technology, it is possible to both capture an image and radiate light to a desired position with a compact configuration.

DESCRIPTION OF EMBODIMENTS

<Configuration Example of an Imaging and Light Emitting Device to which the Present Technology is Applied>

Figure 1:
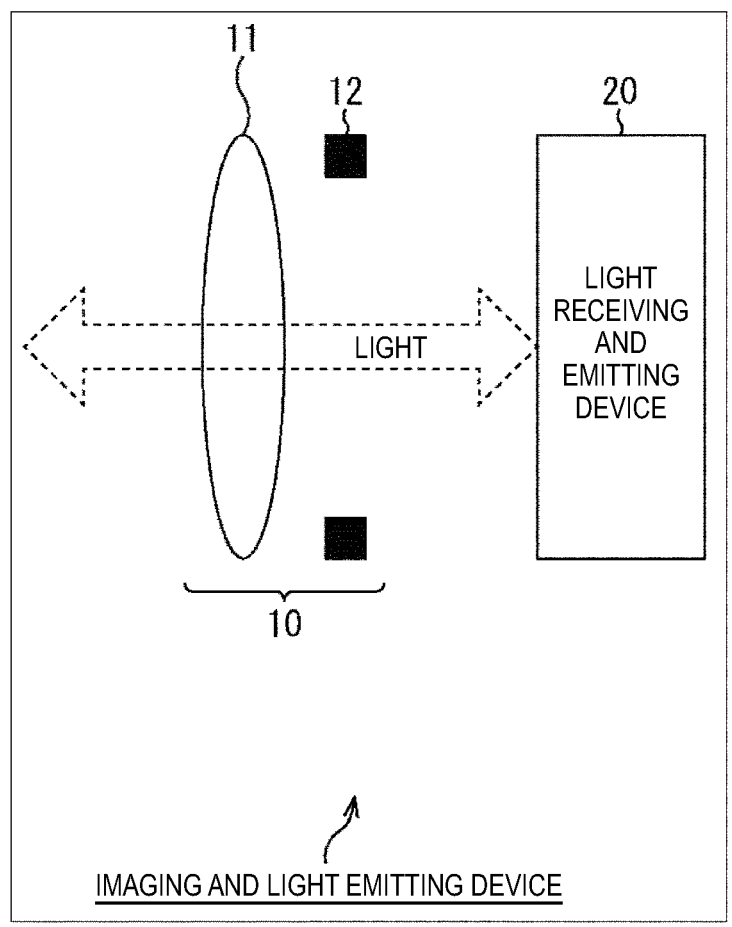
FIG. 1 is a diagram illustrating a configuration example of an embodiment of an imaging and light emitting device to which the present technology is applied.

FIG. 1 is a diagram illustrating a configuration example of an embodiment of an imaging and light emitting device to which the present technology is applied.

In FIG. 1, the imaging and light emitting device has an imaging optical system 10 and a light receiving and emitting device 20.

The imaging optical system 10 causes light from outside (a subject) to be concentrated on (pixels to be described below of) the light receiving and emitting device 20 to form an image.

In FIG. 1, the imaging optical system 10 has an imaging lens 11 and a diaphragm 12.

The imaging lens 11 causes light from outside to be concentrated on the light receiving and emitting device 20 through the diaphragm 12 to form an image.

The diaphragm 12 controls the amount of light incident on the light receiving and emitting device 20 from the imaging lens 11.

The light receiving and emitting device 20 is a device which can perform both light reception and light emission, thereby receiving light incident through the imaging optical system 10 to perform photoelectric conversion to output electric signals which correspond to the amount of light.

In addition, the light receiving and emitting device 20 emits light, and the light is emitted to the outside through the imaging optical system 10.

It should be noted that the light receiving and emitting device 20 can be configured as, for example, one semiconductor chip.

<Overview of a Configuration Example of the Light Receiving and Emitting Device 20>

Figure 2:
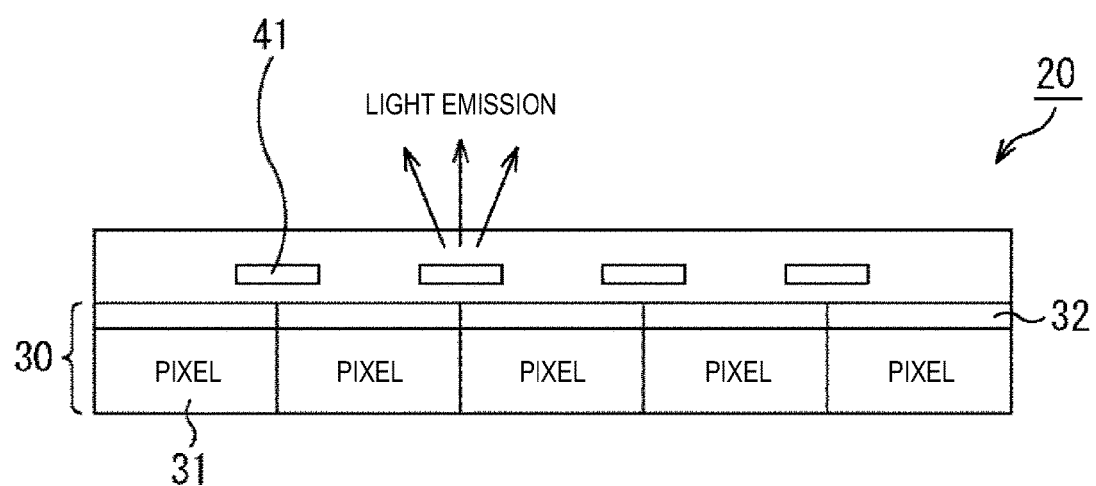
FIG. 2 is a cross-sectional diagram illustrating an overview of a configuration example of a light receiving and emitting device 20.

FIG. 2 is a cross-sectional diagram illustrating an overview of a configuration example of the light receiving and emitting device 20 of FIG. 1.

The light receiving and emitting device 20 has, for example, a flat plate shape, and a configuration in which, for example, light emitting elements are provided in an image sensor such as a complementary metal oxide semiconductor (CMOS) image sensor or a charge coupled device (CCD) image sensor can be adopted as an example of the configuration.

In other words, the light receiving and emitting device 20 has an image sensor unit 30 and a plurality of light emitting units 41 in FIG. 2.

The image sensor unit 30 has a plurality of pixels 31 and a color filter 32.

The plurality of pixels 31 are disposed in a (two-dimensional) lattice shape, receive light incident through the color filter 32, and perform photoelectric conversion to output electric signals corresponding to the amount of the light.

An image of a subject is formed on the plurality of pixels 31 by the imaging optical system 10 (of FIG. 1). Thus, the image of the subject is photoelectrically converted by (the image sensor unit 30 which has) the plurality of pixels 31, and thereby (the image of) the subject is captured.

The color filter 32 is a filter in which the colors R, G, and B are disposed in a predetermined array such as a Bayer array, and a beam of a corresponding color (wavelength) of light incident on the color filter 32 is caused to pass through the array portion of the color and then the light beam of the color is incident on the corresponding pixels. Accordingly, a color image is captured by (the pixels 31 of) the image sensor unit 30.

The light emitting units 41 are elements which emit light, or the like, and are disposed over the color filter 32 of the upper side from which light is incident on the pixels 31 in FIG. 2. As the light emitting units 41, elements which emit light with electron-hole recombination as in, for example, light emitting diodes (LEDs), organic electro-luminescence (EL), and the like, elements which emit light using stimulated emission as in laser or the like, or elements which emit light using any other principle can be adopted.

It should be noted that, in FIG. 2, the light emitting units 41 emit light from their upper sides.

The plurality of light emitting units 41 can be disposed such that 2 or more light emitting units 41 are disposed for every 2 or more pixels 31.

Here, the pattern in which two or more light emitting units 41 are disposed for every 2 or more pixels 31 (which will also be referred to hereinafter as a disposition pattern of the light emitting units 41) is not particularly limited as long as 2 or more light emitting units 41 are allocated to every 2 or more pixels 31.

In other words, as the disposition pattern of the light emitting units 41, for example, a pattern in which M, which is greater than or equal to 2, light emitting units 41 are disposed for every N, which is greater than M and greater than or equal to 2, pixels 31, or a pattern in which two or more light emitting units 41 are disposed for the same number of pixels 31 as the number greater than or equal to 2 of the light emitting units 41 can be adopted.

When the pattern in which M, which is greater than or equal to 2, light emitting units 41 are each disposed for every N, which is greater than M and greater than or equal to 2, pixels 31 is employed, one light emitting unit 41 can be consequently disposed for every arbitrary number of pixels 31, such as several pixels, hundreds of pixels, thousands of pixels, tens of thousands of pixels, or hundreds of thousands of pixels.

In addition, when the pattern in which 2 or more light emitting units 41 are disposed for the same number of pixels 31 as the number greater than or equal to 2 of the light emitting units 41 is employed, 1 light emitting unit 41 can be consequently disposed for 1 pixel 31.

Furthermore, density of disposition of the light emitting units 41 may not be uniform. In other words, the number of light emitting units 41 disposed for every 2 or more pixels 31 may differ according to positions at which they are disposed.

Specifically, the light emitting units 41 can be densely disposed at the center of the image sensor unit 30 (the center of the plurality of pixels 31 disposed in the lattice shape) and the light emitting units 41 can be sparsely disposed in the peripheral portions. In this case, the total number of necessary light emitting units 41 is lower than when the light emitting units 41 are disposed in uniform density, and thereby the light receiving and emitting device 20 can be configured at a low price.

It should be noted that, although the light emitting units 41 are provided above the pixels 31, separate from the pixels 31 in FIG. 2, the pixels 31 and the light emitting units 41 can be formed in an integrated manner.

In other words, the pixels 31 and the light emitting unit 41 can be formed in an integrated manner using, for example, a film that is made of a material for performing photoelectric conversion and light emission (which will be referred to hereinafter as a light emitting photoelectric conversion film), or the like.

As the light emitting photoelectric conversion film, for example, a semiconductor having a p-n junction, an organic EL material, or the like can be employed. In this case, the light emitting photoelectric conversion film functions as the pixel 31 when reverse bias is applied, and functions as the light emitting unit 41 when forward bias is applied.

Here, the light emitting unit 41 (including the light emitting unit 41 formed to be integrated with the pixels 31 (the light emitting photoelectric conversion film or the like)) can be formed of, for example, a group III-V (3-5) compound, a group II-VI (2-6) compound, or a group I-III-VI (1-3-6) compound such as an AlGaInN-based, GaInNAs-based, AlGaInP-based, AlGaAs-based, GaAsInP-based, MgZnCdSSe-based, or CuInGaSSe-based compound, a compound semiconductor material which contains quantum dots or a quantum well of these, an organic material such as an organic EL, or another light emitting material.

In addition, light emitted by the light emitting units 41 may be incoherent light emitted by an LED or the like, or may be coherent light such as laser light.

It should be noted that light emitted by the light emitting units 41 turns into stray light and is received by the pixels 31 at the time of imaging by (the pixels 31 of) the image sensor unit 30, and then may give an adverse effect as noise.

Thus, by providing a light blocking film which blocks light below the light emitting units 41 as in FIG. 2, for example, the light emitted by the light emitting units 41 can be prevented from giving an adverse effect as noise during imaging.

In addition, it is possible to prevent light emitted by the light emitting units 41 from giving an adverse effect as noise during imaging by, for example, performing imaging in (the pixels 31 of) the image sensor unit 30 and light emission of the light emitting units 41 at different time points, for example, performing them in an alternate manner.

Figure 3:
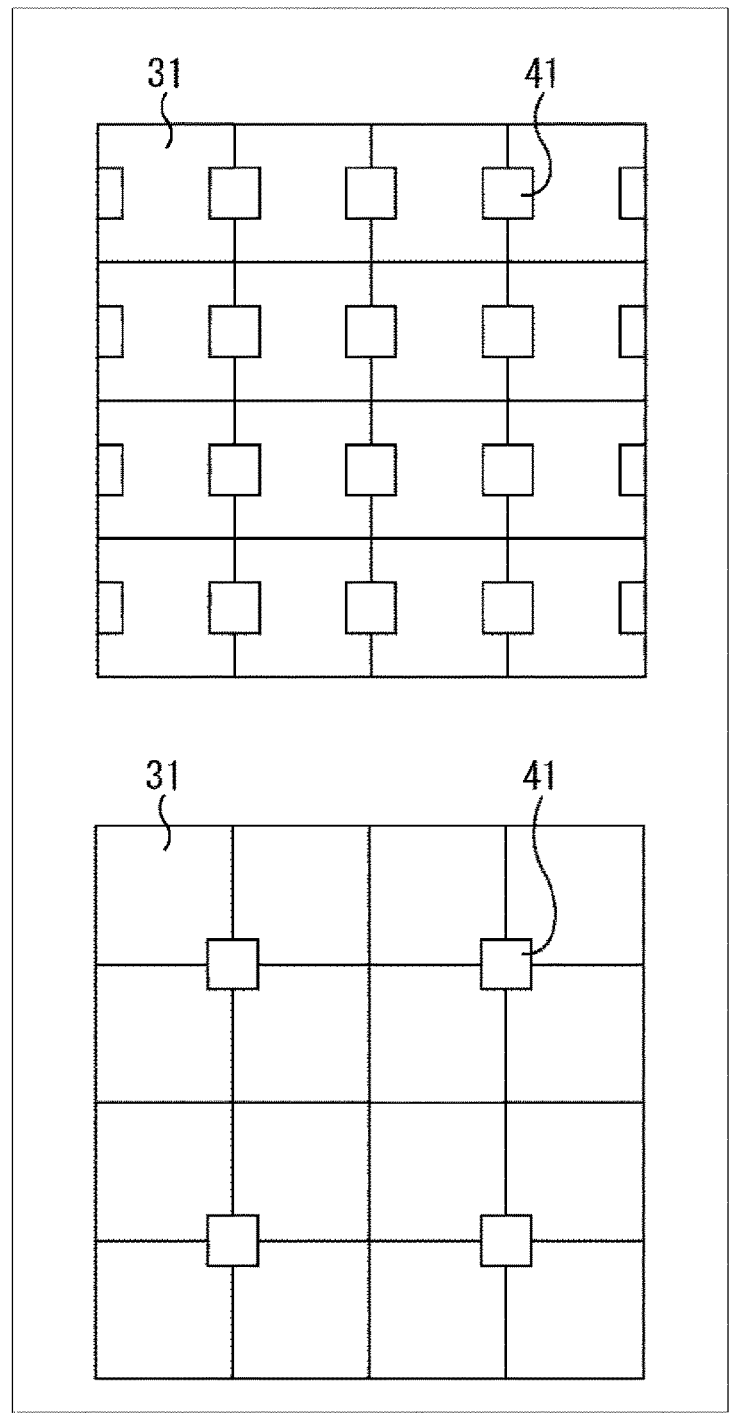
FIG. 3 is a planar diagram illustrating an example of disposition of light emitting units 41 in the light receiving and emitting device 20.

FIG. 3 is a planar diagram of the light receiving and emitting device 20 illustrating an example of disposition of the light emitting units 41 in the light receiving and emitting device 20 of FIG. 2.

Each of light emitting units 41 can be provided between 2 pixels 31 that are adjacent to each other in the left-right direction (or the up-down direction) as illustrated in, for example, FIG. 3. In addition, using 2×2 (horizontal×vertical) adjacent pixels 31 in which the light emitting units 41 are provided as a mounting unit as illustrated in, for example, FIG. 3, the light emitting units 41 can each be disposed at the center (center of mass) position of the 2×2 pixels (between 2 pixels 31 that are diagonally adjacent to each other).

It should be noted that, when the light emitting units 41 are each provided between every 2 pixels 31 that are adjacent to each other in the left-right direction (or the up-down direction), the light emitting units 41 are each provided at the ratio of (substantially) 1 to 1 pixel 31. In addition, when the light emitting units 41 are each provided on the mounting unit of the 2×2 adjacent pixels 31, the light emitting units 41 are provided at the ratio of 1 to 4 pixels 31.

<Applications in Which the Imaging and Light Emitting Device is Used>

It is possible to perform both of capturing of an image and radiation of light to a desired position with a compact configuration in the imaging and light emitting device which has the imaging optical system 10 and the light receiving and emitting device 20 as illustrated in FIG. 1, and it can be used in various applications for that effect.

In other words, the imaging and light emitting device of FIG. 1 can, for example, capture an image and radiate light to a desired position of a subject reflected on that image.

The principle of reversibility of light makes it possible for the imaging and light emitting device to perform capturing of an image and radiation of light to a desired position of a subject reflected on that image.

Figure 4:
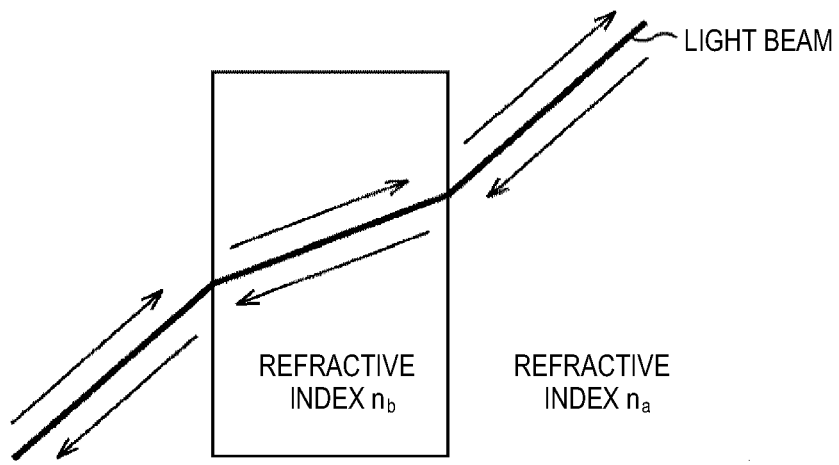
FIG. 4 is a diagram for describing the principle of reversibility of light.

FIG. 4 is a diagram for describing the principle of reversibility of light.

The principle of reversibility of light is that, if light is caused to travel in reverse at a certain point on its optical path, which indicates where the light has traveled, the light travels in reverse along the optical path along which it traveled forward, and the principle of reversibility of light is valid even when there is a medium having a different refractive index on the optical path as illustrated in FIG. 4.

Figure 5:
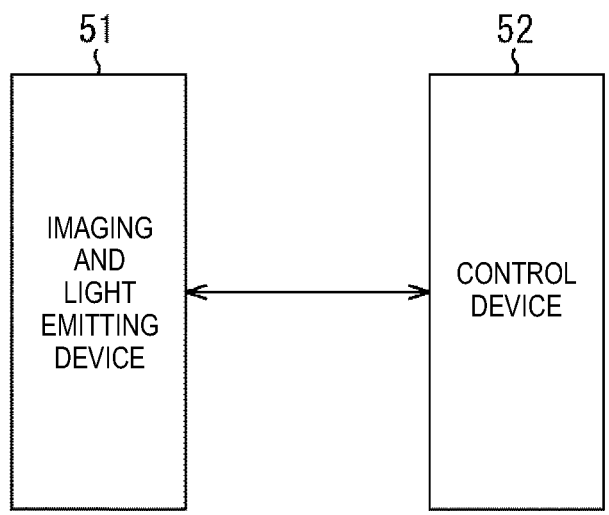
FIG. 5 is a block diagram illustrating a configuration example of an embodiment of an imaging and light emitting system which uses the imaging and light emitting device.

FIG. 5 is a block diagram illustrating a configuration example of an embodiment of an imaging and light emitting system which uses the imaging and light emitting device of FIG. 1.

In FIG. 5, the imaging and light emitting system has an imaging and light emitting device 51 and a control device 52.

The imaging and light emitting device 51 has the same configuration as the imaging and light emitting device of FIG. 1, and thus has the imaging optical system 10 and the light receiving and emitting device 20.

The control device 52 independently controls light emission of each of the plurality of light emitting units 41 (of FIG. 2) of the light receiving and emitting device 20 that the imaging and light emitting device 51 has.

In addition, the control device 52 controls capturing of images performed by the imaging and light emitting device 51.

Furthermore, the control device 52 receives supply of images captured by the imaging and light emitting device 51 from the imaging and light emitting device 51.

The control device 52 processes the images from the imaging and light emitting device 51 when necessary. For example, the control device 52 recognizes an image from the imaging and light emitting device 51, and causes the light emitting units 41 (of the light receiving and emitting device 20) of the imaging and light emitting device 51 to emit light based on a result of the recognition of the image.

In addition, the control device 52 causes the light emitting units 41 of the imaging and light emitting device 51 to emit light according to a manipulation of a user who possesses the imaging and light emitting system of FIG. 5 or the like.

The imaging and light emitting system of FIG. 5 can be applied to communication devices which exchange information using light or mobile terminals which function as imaging devices (digital cameras) that capture images, and such a mobile terminal can be applied to, for example, tablet terminals such as smartphones, mobile game devices, and other kinds of electronic devices.

Figure 6:
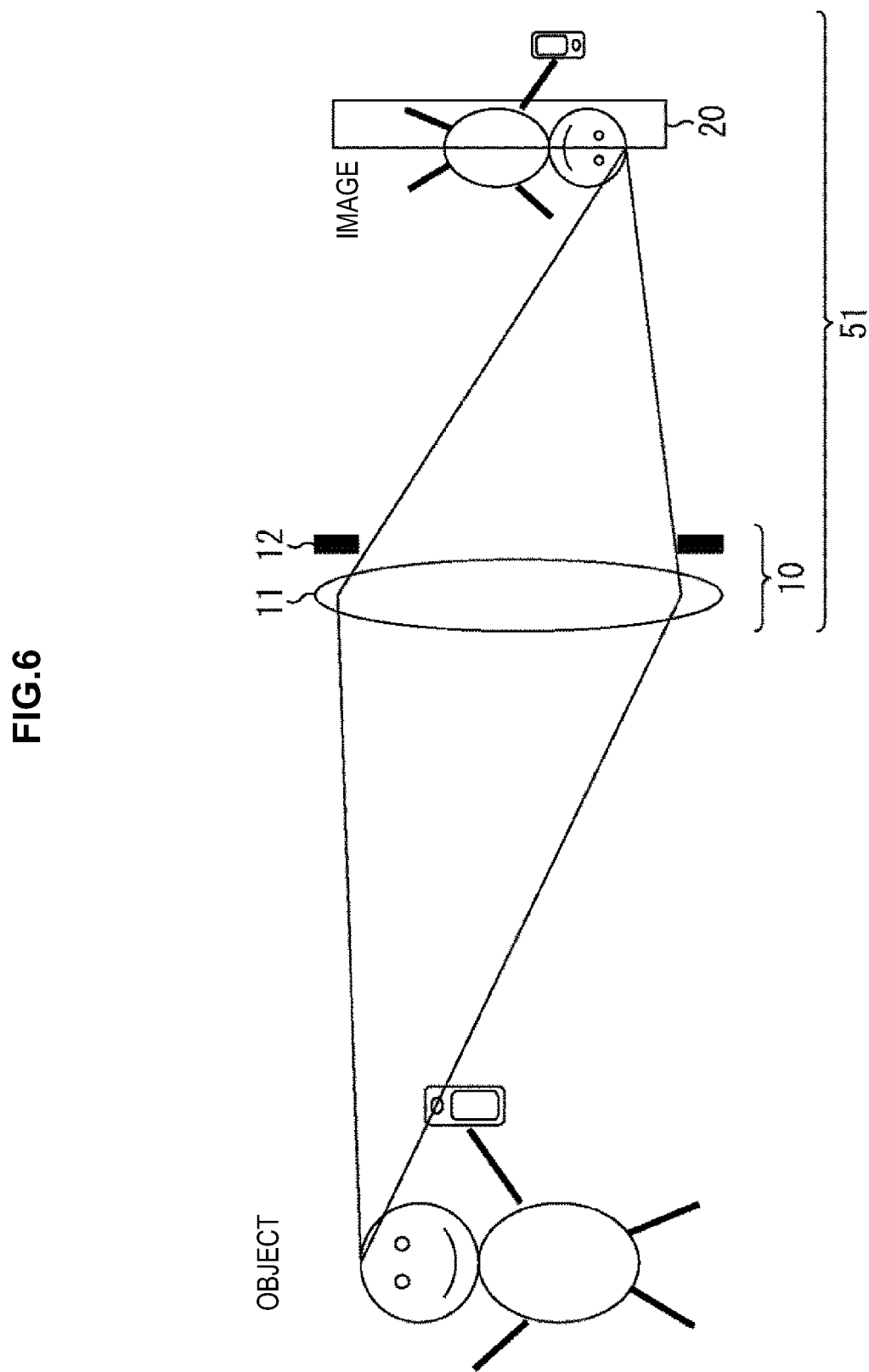
FIG. 6 is a diagram for describing capturing of an image with the imaging and light emitting device 51 of the imaging and light emitting system.

FIG. 6 is a diagram for describing capturing of an image with the imaging and light emitting device 51 of the imaging and light emitting system of FIG. 5.

Capturing an image with the imaging and light emitting device 51 is performed by the imaging optical system 10 forming an image of light from an object that is a subject on the light receiving and emitting device 20, whereby an image of the subject is formed on the light receiving and emitting device 20 as illustrated in FIG. 6.

In other words, the image formed on the light receiving and emitting device 20 is photoelectrically converted by the plurality of pixels 31 of the light receiving and emitting device 20, and thereby the image of the subject is captured by the light receiving and emitting device 20.

Since each point of the subject corresponds to a point of the image of the subject one to one, one certain point on the image captured in the light receiving and emitting device 20 corresponds to one point of the subject.

Figure 7:
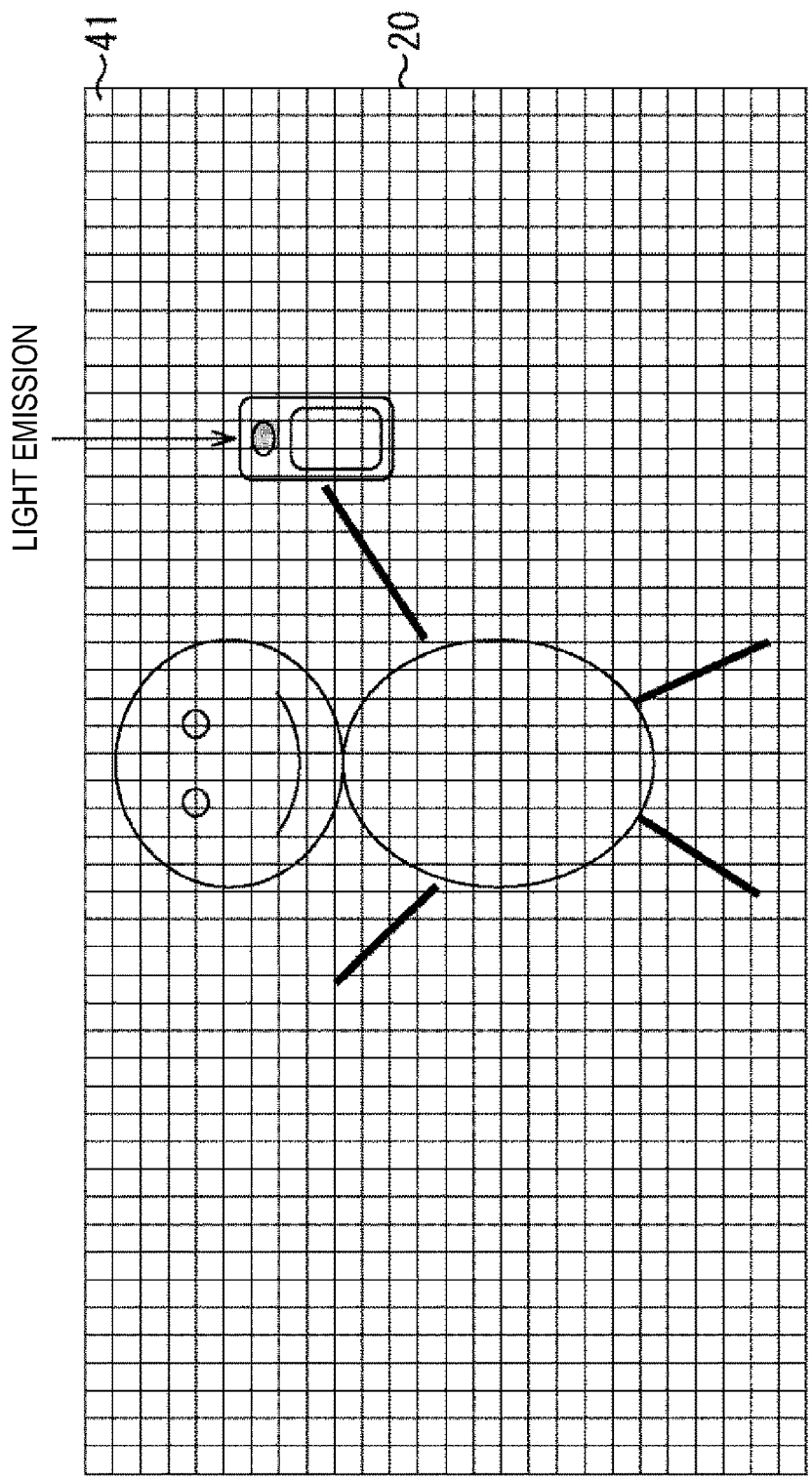
FIG. 7 is a diagram illustrating an image captured by the imaging and light emitting device 51 and light emission of the light emitting units 41.

FIG. 7 is a diagram illustrating an image of a subject formed on the light receiving and emitting device 20, i.e., an image captured by the imaging and light emitting device 51 and light emission of the light emitting units 41.

The plurality of light emitting units 41 are disposed to be packed, so to speak, in the light receiving and emitting device 20 in a form in which 2 or more light emitting units 41 are allocated to every 2 or more pixels 31.

Thus, with regard to an arbitrary position on the image captured by the imaging and light emitting device 51, by adopting (one) light emitting unit 41 that is closest to the arbitrary position on the image captured by the imaging and light emitting device 51 (the image of the subject formed on the light receiving and emitting device 20) as a light emitting unit 41 corresponding to the arbitrary position, the light emitting unit 41 corresponding to the arbitrary position can be caused to emit light in the imaging and light emitting device 51.

By causing the light emitting unit 41 corresponding to the arbitrary position to emit light in the imaging and light emitting device 51, optical communication can be performed in the imaging and light emitting system of FIG. 5.

In other words, according to the imaging and light emitting system of FIG. 5, a communication system which can perform optical communication can be configured using capturing of an image by the imaging and light emitting device 51 and light emission of the light emitting units 41.

Figure 8:
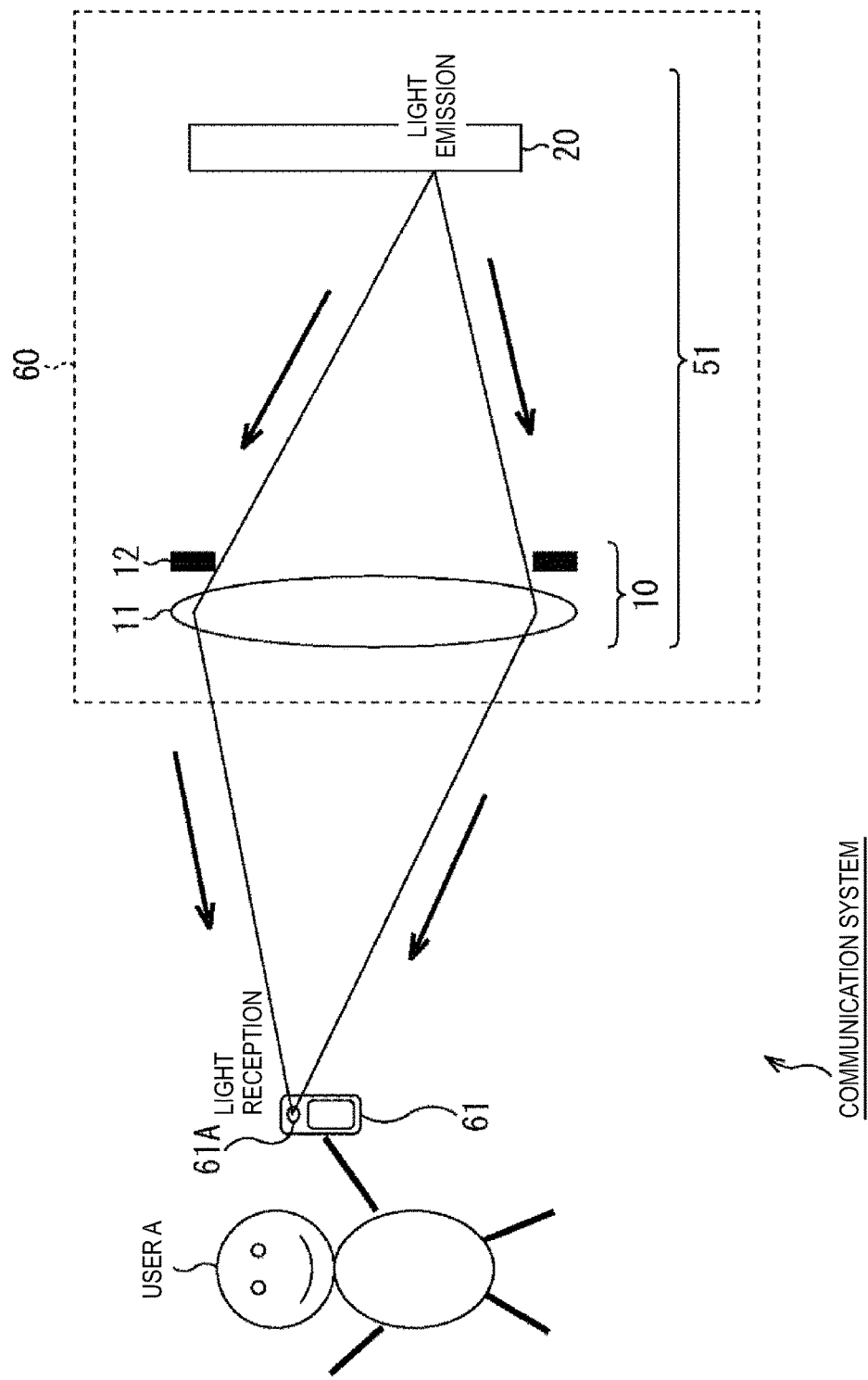
FIG. 8 is a diagram illustrating a first configuration example of a communication system which uses the imaging and light emitting system.

FIG. 8 is a diagram illustrating a first configuration example of the communication system which uses the imaging and light emitting system of FIG. 5.

The communication system is constituted by mobile terminals 60 and 61 in FIG. 8.

The mobile terminal 60 has the same configuration as the imaging and light emitting system of FIG. 5.

The mobile terminal 61 also has the same configuration as the imaging and light emitting system of FIG. 5. It should be noted that the block of the mobile terminal 61 which corresponds to the imaging and light emitting device 51 is denoted as an imaging and light emitting device 61A.

In FIG. 8, a user A is holding the mobile terminal 61 toward the mobile terminal 60.

Thus, the imaging and light emitting device 51 of the mobile terminal 60 can image the user A holding the mobile terminal 61 toward the mobile terminal 60 along with the mobile terminal 61.

When a light emitting unit 41 corresponding to a position (a specific position) of the imaging and light emitting device 61A of the mobile terminal 61 which is reflected on the image captured by the imaging and light emitting device 51 is caused to emit light in the imaging and light emitting device 51, light emitted by the light emitting unit 41 is radiated to be focused on the imaging and light emitting device 61A of the mobile terminal 61 based on the principle of reversibility of light.

Thus, as the imaging and light emitting device 61A of the mobile terminal 61 receives the light from (the light emitting unit 41 of) the imaging and light emitting device 51, optical communication in which information is transmitted from the mobile terminal 60 to the mobile terminal 61 can be performed.

As described above, by causing the light emitting unit 41 corresponding to the position of the imaging and light emitting device 61A of the mobile terminal 61 which is reflected on the image captured by the imaging and light emitting device 51 to emit light in the imaging and light emitting device 51, the light can be radiated only to the imaging and light emitting device 61A of the mobile terminal 61 as a desired position, and thus optical communication can be performed without leaking information to the outside.

On the other hand, when the imaging and light emitting device 61A of the mobile terminal 61 emits light in the same way, the light is received by a pixel 31 (of FIG. 2) of the imaging and light emitting device 51 of the mobile terminal 60 which corresponds to the position of the imaging and light emitting device 61A of the mobile terminal 61 reflected on the image captured by the imaging and light emitting device 51, and thus the mobile terminal 60 can receive information corresponding to the light from the imaging and light emitting device 61A. Thus, optical communication in which information is transmitted from the mobile terminal 61 to the mobile terminal 60 can be performed.

Here, in order to cause the light emitting unit 41 corresponding to the position of the imaging and light emitting device 61A of the mobile terminal 61 reflected on the image captured by the imaging and light emitting device 51 to emit light in the imaging and light emitting device 51, it is necessary for the mobile terminal 60 to recognize the position (specific position) of the imaging and light emitting device 61A of the mobile terminal 61 on the image captured by the imaging and light emitting device 51, and the recognition is performed by the control device 52 (of FIG. 5) of the mobile terminal 60.

In other words, the control device 52 recognizes the position of the imaging and light emitting device 61A of the mobile terminal 61 on the image captured by the imaging and light emitting device 51 by performing image recognition on the image captured by the imaging and light emitting device 51.

In addition, the control device 52 controls the light emitting unit 41 corresponding to the position of the imaging and light emitting device 61A of the mobile terminal 61 on the image captured by the imaging and light emitting device 51 based on a result of the image recognition to cause the light emitting unit 41 to emit light, and thereby the light is radiated only to the imaging and light emitting device 61A of the mobile terminal 61.

It should be noted that the recognition of the position of the imaging and light emitting device 61A of the mobile terminal 61 on the image captured by the imaging and light emitting device 51 can be performed in another way, for example, by causing the imaging and light emitting device 61A to emit light for a predetermined period or to flicker in a predetermined pattern and the control device 52 of the mobile terminal 60 detecting a position (pixel 31) having luminance of a predetermined value or higher or a position at which flickering is shown in the predetermined pattern on the image captured by the imaging and light emitting device 51.

In addition, the position of the imaging and light emitting device 61A of the mobile terminal 61 on the image captured by the imaging and light emitting device 51 can be recognized when, for example, the user views the image captured by the imaging and light emitting device 51 and points to the position.

Here, when focus strays during capturing by the imaging and light emitting device 51, the image captured by the imaging and light emitting device 51 becomes blurry. In this case, light emitted by the (light emitting unit 41 of) imaging and light emitting device 51 also becomes blurry, and thus the light is radiated to the imaging and light emitting device 61A of the mobile terminal 61 with a width caused by the certain degree of blur.

In order to concentrate light emitted by the imaging and light emitting device 51 on (one point of) the imaging and light emitting device 61A of the mobile terminal 61, it is necessary for the imaging and light emitting device 51 to set the focus during capturing.

However, since the imaging lens 11 (and other lenses not illustrated, such as a focus lens) included in the imaging optical system 10 (of FIG. 1) of the imaging and light emitting device 51 does not have aberration and a diffraction limit, even if the focus is actually taken during capturing by the imaging and light emitting device 51, the light emitted by the imaging and light emitting device 51 is concentrated on the imaging and light emitting device 61A of the mobile terminal 61 with a certain width.

When the light emitted by the imaging and light emitting device 51 is concentrated on the imaging and light emitting device 61A of the mobile terminal 61 with a certain width, a plurality of pixels of the imaging and light emitting device 61A receive the light emitted by the imaging and light emitting device 51; however, even when the plurality of pixels receive (sense) the light emitted by the imaging and light emitting device 51 as above, it does not particularly affect optical communication.

It should be noted that, in the communication system of FIG. 8, in unidirectional optical communication in which only one of the mobile terminals 60 and 61 transmits to the other, that is, when unidirectional optical communication from the mobile terminal 60 to the mobile terminal 61 is performed, for example, the mobile terminal 61 that only receives information may have a light receiving function, and may not have a light emitting function.

Figure 9:
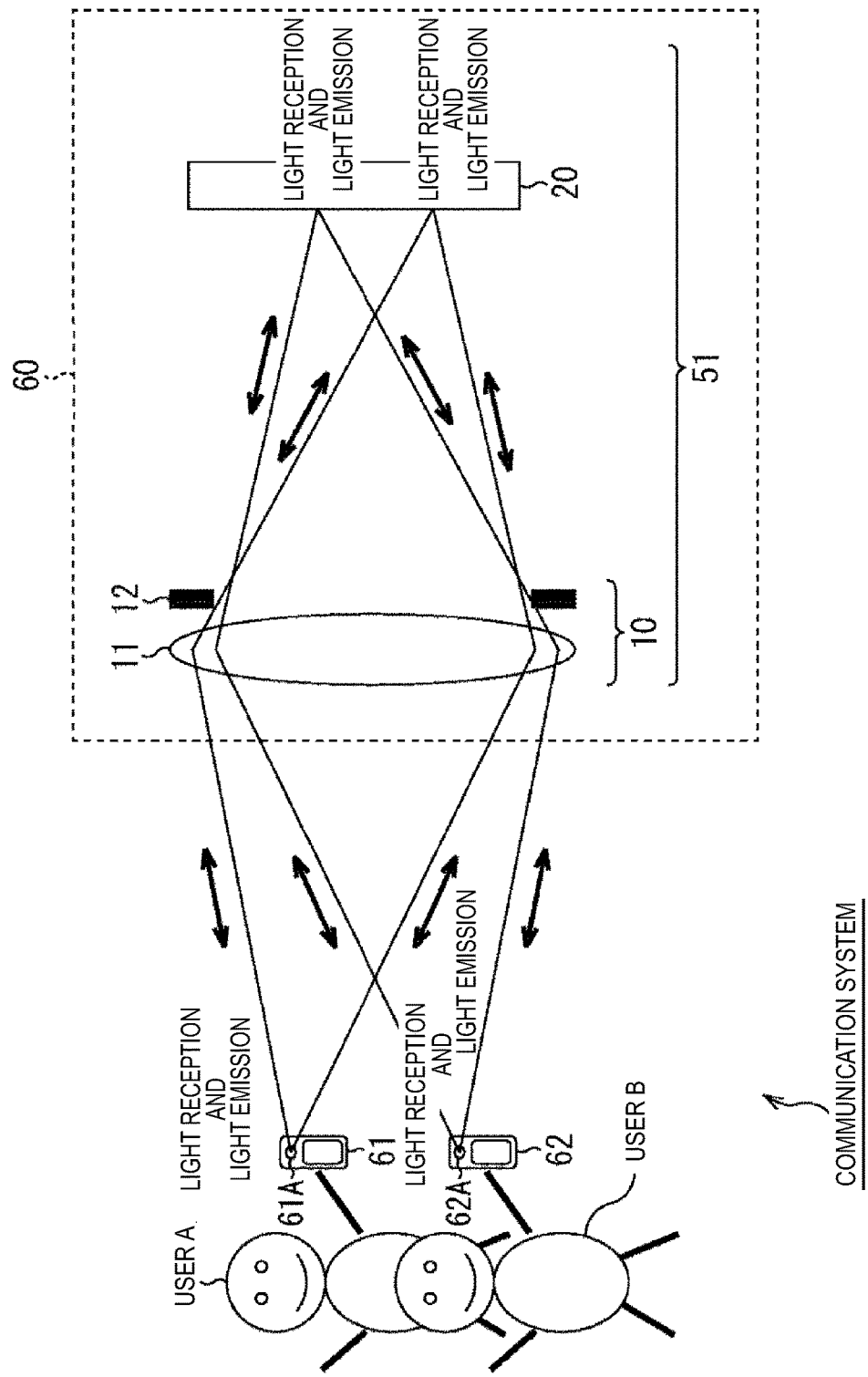
FIG. 9 is a diagram illustrating a second configuration example of the communication system which uses the imaging and light emitting system.

FIG. 9 is a diagram illustrating a second configuration example of the communication system which uses the imaging and light emitting system of FIG. 5.

It should be noted that the same reference numerals are given to portions corresponding to those of the communication system of FIG. 8 in the drawing, and description thereof will hereinbelow be appropriately omitted.

The communication system is constituted by mobile terminals 60, 61, and 62 in FIG. 9.

The mobile terminal 62 has the same configuration as the imaging and light emitting system of FIG. 5. It should be noted that the block of the mobile terminal 62 which corresponds to the imaging and light emitting device 51 is denoted as an imaging and light emitting device 62A.

In FIG. 9, the user A is holding the mobile terminal 61 toward the mobile terminal 60 as in FIG. 8. Furthermore, in FIG. 9, a user B who is at a position at which he or she does not block the user A from the perspective of the mobile terminal 60 is holding the mobile terminal 62 toward the mobile terminal 60 in the same way.

Thus, the imaging and light emitting device 51 of the mobile terminal 60 can image the user A holding the mobile terminal 61 toward the mobile terminal 60 and the user B holding the mobile terminal 62 toward the mobile terminal 60.

As described in FIG. 8, when the light emitting unit 41 corresponding to the position of the imaging and light emitting device 61A of the mobile terminal 61 held by the user A which is reflected on the image captured by the imaging and light emitting device 51 is caused to emit light in the imaging and light emitting device 51, the light emitted by the light emitting unit 41 is radiated only to the imaging and light emitting device 61A of the mobile terminal 61 based on the principle of reversibility of light.

Thus, as the imaging and light emitting device 61A of the mobile terminal 61 receives the light from (the light emitting unit 41 of) the imaging and light emitting device 51, optical communication in which information is transmitted from the mobile terminal 60 to the mobile terminal 61 can be performed.

Likewise, when a light emitting unit 41 corresponding to the position of the imaging and light emitting device 62A of the mobile terminal 62 held by the user B which is reflected on the image captured by the imaging and light emitting device 51 is caused to emit light in the imaging and light emitting device 51, the light emitted by the light emitting unit 41 is radiated only to the imaging and light emitting device 62A of the mobile terminal 62 based on the principle of reversibility of light.

Thus, as the imaging and light emitting device 62A of the mobile terminal 62 receives the light from the (light emitting unit 41 of) imaging and light emitting device 51, optical communication in which information is transmitted from the mobile terminal 60 to the mobile terminal 61 can be performed.

Based on the above, as the control device 52 (of FIG. 5) of the mobile terminal 60, for example, performs image recognition of the image captured by the imaging and light emitting device 51 and separately controls the light emitting unit 41 corresponding to the position of the imaging and light emitting device 61A of the mobile terminal 61 and the light emitting unit 41 corresponding to the position of the imaging and light emitting device 62A of the mobile terminal 62 that are on the image captured by the imaging and light emitting device 51 based on a result of the image recognition to cause the units to emit light, optical communication in which information is separately transmitted from the mobile terminal 60 to the mobile terminals 61 and 62 can be performed.

On the other hand, when the imaging and light emitting device 61A of the mobile terminal 61 emits light in the same way, the light is received by a pixel 31 of the imaging and light emitting device 51 of the mobile terminal 60 corresponding to the position of the imaging and light emitting device 61A of the mobile terminal 61 reflected on the image captured by the imaging and light emitting device 51, and thus the mobile terminal 60 can receive information according to the light from the imaging and light emitting device 61A. Thus, optical communication in which information is transmitted from the mobile terminal 61 to the mobile terminal 60 can be performed.

Furthermore, when the imaging and light emitting device 62A of the mobile terminal 62 emits light in the same way, the light is received by a pixel 31 of the imaging and light emitting device 51 of the mobile terminal 60 corresponding to the position of the imaging and light emitting device 62A of the mobile terminal 62 reflected on the image captured by the imaging and light emitting device 51, and thus the mobile terminal 60 can receive information according to the light from the imaging and light emitting device 62A. Thus, optical communication in which information is transmitted from the mobile terminal 62 to the mobile terminal 60 can be performed.

As described above, the mobile terminal 60 can perform optical communication with the two plural mobile terminals 61 and 62 simultaneously and independently without leaking information to the outside (other than between the communication partners).

It should be noted that the mobile terminal 60 can similarly perform optical communication with 3 or more mobile terminals without leaking information to the outside.

Figure 10:
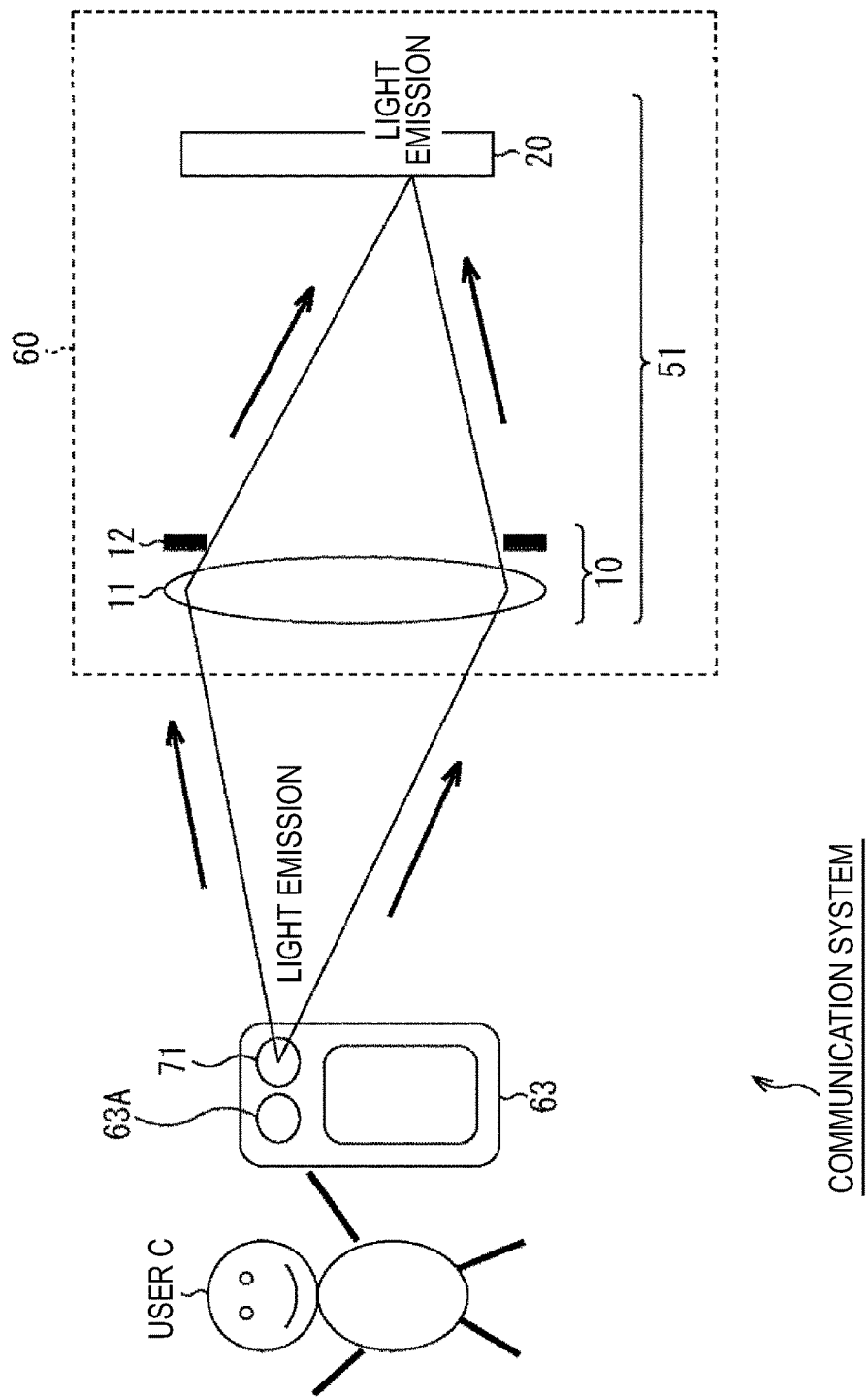
FIG. 10 is a diagram illustrating a third configuration example of the communication system which uses the imaging and light emitting system.

FIG. 10 is a diagram illustrating a third configuration example of the communication system which uses the imaging and light emitting system of FIG. 5.

It should be noted that the same reference numerals are given to portions corresponding to those of the communication system of FIG. 8 in the drawing, and description thereof will hereinbelow be appropriately omitted.

The communication system is constituted by mobile terminals 60 and 63 in FIG. 10.

The mobile terminal 63 has the same configuration as the imaging and light emitting system of FIG. 5. However, the mobile terminal 63 is different from the imaging and light emitting system of FIG. 5 in that a light emitting device 71 is newly provided. It should be noted that the block of the mobile terminal 63 which corresponds to the imaging and light emitting device 51 is denoted as an imaging and light emitting device 63A.

The light emitting device 71 of the mobile terminal 63 is a block with the light emitting function separate from the imaging and light emitting device 63A, and is provided near the imaging and light emitting device 63A.

As the light emitting device 71 emits light in a predetermined pattern, identification information for identifying the (user C holding the) mobile terminal 63 that serves as a communication partner of the mobile terminal 60 is transmitted.

In FIG. 10, the user C is holding the mobile terminal 63 toward the mobile terminal 60, and the imaging and light emitting device 51 of the mobile terminal 60 images the user C holding the mobile terminal 63 toward the mobile terminal 60 along with the mobile terminal 63.

Thus, when the identification information is transmitted as the light emitting device 71 emits light, the imaging and light emitting device 51 of the mobile terminal 60 receives the light emitted by the light emitting device 71, and based on the identification information obtained from the light of the light emitting device 71 received by the imaging and light emitting device 51, the control device 52 (of FIG. 5) identifies the mobile terminal 63 that is the communication partner.

Here, the identification information includes information indicating that it is identification information (the light of the predetermined pattern emitted by the light emitting device 71 includes light of a pattern that indicates that the light is identification information).

When the control device 52 identifies the mobile terminal 63 that is the communication partner, the mobile terminal 60 starts optical communication with the mobile terminal 63 as described in FIG. 8.

It should be noted that, when the light emitting device 71 is provided near the imaging and light emitting device 63A as described above, the mobile terminal 60 recognizes the position at which the light serving as the identification information from the light emitting device 71 is received as a position of the imaging and light emitting device 63A of the mobile terminal 63 on the image captured by the imaging and light emitting device 51, causes a light emitting unit 41 corresponding to the position to emit light, and thereby can transmit information to the mobile terminal 63.

In addition, since it is not necessary for the light emitted by the light emitting device 71 to be radiated at a specific position, it is not necessary to provide an imaging optical system that is equivalent to the imaging optical system 10 (of FIG. 1) of the imaging and light emitting device 51 in the light emitting device 71.

Furthermore, a light emitting device equivalent to the light emitting device 71 of the mobile terminal 63 can also be provided in the mobile terminal 60.

According to the imaging and light emitting system of FIG. 5, a communication system for performing optical communication can be configured as described above; however, a medical endoscope system for performing medical tests or treatment on a specific position of an organ of a human body by radiating light to the specific position can also be configured.

In other words, according to the imaging and light emitting system of FIG. 5, a medical endoscope system for performing medical tests or the like on a human body using capturing of an image with the imaging and light emitting device 51 and light emission of the light emitting unit 41 can be configured.

Figure 11:
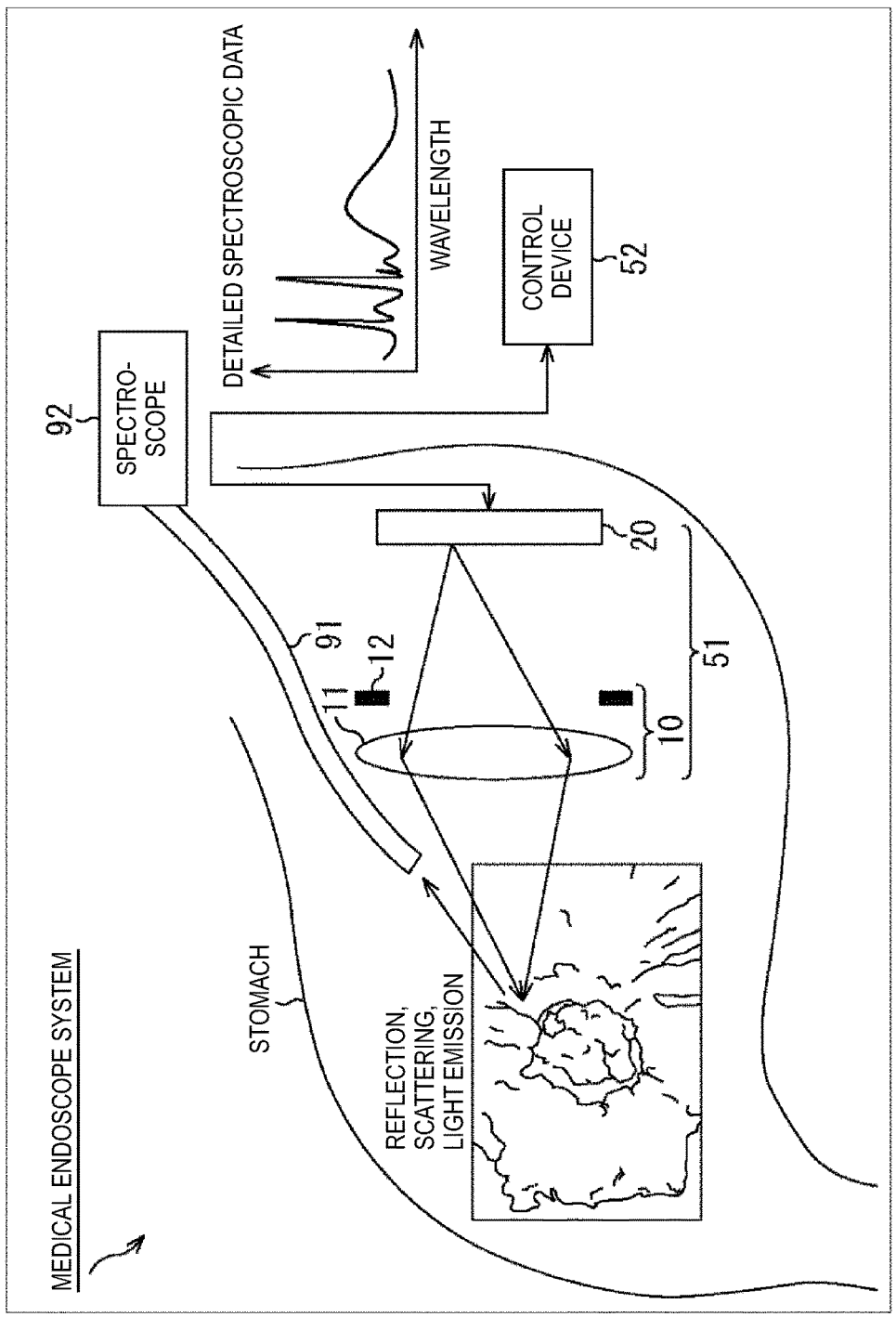
FIG. 11 is a diagram illustrating a first configuration example of a medical endoscope system which uses the imaging and light emitting system.

FIG. 11 is a diagram illustrating a first configuration example of the medical endoscope system which uses the imaging and light emitting system of FIG. 5.

It should be noted that the same reference numerals are given to portions corresponding to those of the imaging and light emitting system of FIG. 5 in the drawing, and description thereof will hereinbelow be appropriately omitted.

In the medical endoscope system, an image of the inside of an organ such as the stomach of a human body is captured, and a specific position of (the inside of) the organ is recognized from the image. Then, as light is radiated to the specific position, a medical test, treatment, or the like of the specific position is performed.

The medical endoscope system is constituted by the imaging and light emitting device 51, the control device 52, an optical fiber 91, and a spectroscope 92 in FIG. 11.

In FIG. 11, the imaging and light emitting device 51 and the optical fiber 91 are inserted into the stomach from the mouth or nose of the human body.

The imaging and light emitting device 51 captures an image of a surface of the inside of the stomach, and supplies the image to the control device 52.

Here, in the medical endoscope system of FIG. 11, capturing of the image of the stomach by the imaging and light emitting device 51 can be performed by causing some or all of the plurality of light emitting units 41 provided in the (light receiving and emitting device 20 included in) imaging and light emitting device 51 to emit light to be radiated to the inside of the stomach that is the imaging target.

The control device 52 recognizes a specific position of (the inside of) the stomach through, for example, image recognition of the image from the imaging and light emitting device 51 or an instruction from a medical staff who has seen the image, and the light emitting unit 41 (of FIG. 2) corresponding to the position on the image from the imaging and light emitting device 51 at which the specific position is reflected emits light (is controlled to emit light).

As a result, light is radiated to the specific position of the stomach.

Here, in the medical endoscope system, all other types of light necessary for a medical test or treatment such as ultraviolet light and the like can be employed as the light emitted by the light emitting units 41 when necessary in addition to visible light.

In addition, it is possible to dispose a plurality of kinds of light emitting units which emit different types of light such as visible light and non-visible light such as ultraviolet light in a set in the light receiving and emitting device 20 (of FIG. 2) and to select arbitrary kinds of light emitting units from the plurality of kinds of light emitting units to cause the units to emit light.

When light from the imaging and light emitting device 51 is radiated to the specific position of the stomach, the light is reflected or scattered at the specific position, and thus reflected or scattered light is generated.

In addition, when there is a marker of a disease at the specific position of the stomach and light emitted from the light emitting units 41 is excitation light which excites the marker (for example, light having a short wavelength such as ultraviolet light or green light), the marker emits fluorescent or phosphorescent light by receiving the excitation light from the light emitting units 41.

Here, the marker includes, for example, a natural fluorescent substance such as collagen, or a chemical substance such as an iridium complex having the property of shining brightly in a hypoxic state (it emits light particularly in a cancerous tissue because oxygen is depleted in cancerous tissues).

The optical fiber 91 guides reflected light, scattered light, fluorescent light or phosphorescent light generated at the specific position of the stomach to the spectroscope 92 outside the human body.

The spectroscope 92 performs spectroscopic measurement using, for example, a grating method or the like targeting the light from the optical fiber 91, i.e., the reflected light, scattered light, fluorescent light or phosphorescent light generated at the specific position of the stomach, thereby obtaining the optical spectrum (spectral characteristic) of the reflected light, scattered light, fluorescent light or phosphorescent light generated at the specific position of the stomach as spectroscopic data.

As described above, according to the medical endoscope system of FIG. 11, light is radiated to a desired position inside an organ and thereby the optical spectrum of reflected light from the desired position or the like can be obtained.

It should be noted that, in FIG. 11, the optical fiber 91 guides the reflected light or the like generated at the specific position of the stomach to the spectroscope 92 outside the human body to perform spectroscopic measurement on the reflected light or the like; however, the spectroscope 92 can be configured in a small size to perform spectroscopic measurement by being inserted into the inside of the stomach along with the imaging and light emitting device 51.

In addition, as the control device 52 causes some or all of the plurality of light emitting units 41 provided in (the light receiving and emitting device 20 included in) the imaging and light emitting device 51 to sequentially emit light in the medical endoscope system of FIG. 11, it is possible to scan the radiation positions of light and create a so-called spectral map that is the optical spectrum of each position of a part or the entire image of the stomach captured by the imaging and light emitting device 51.

Figure 12:
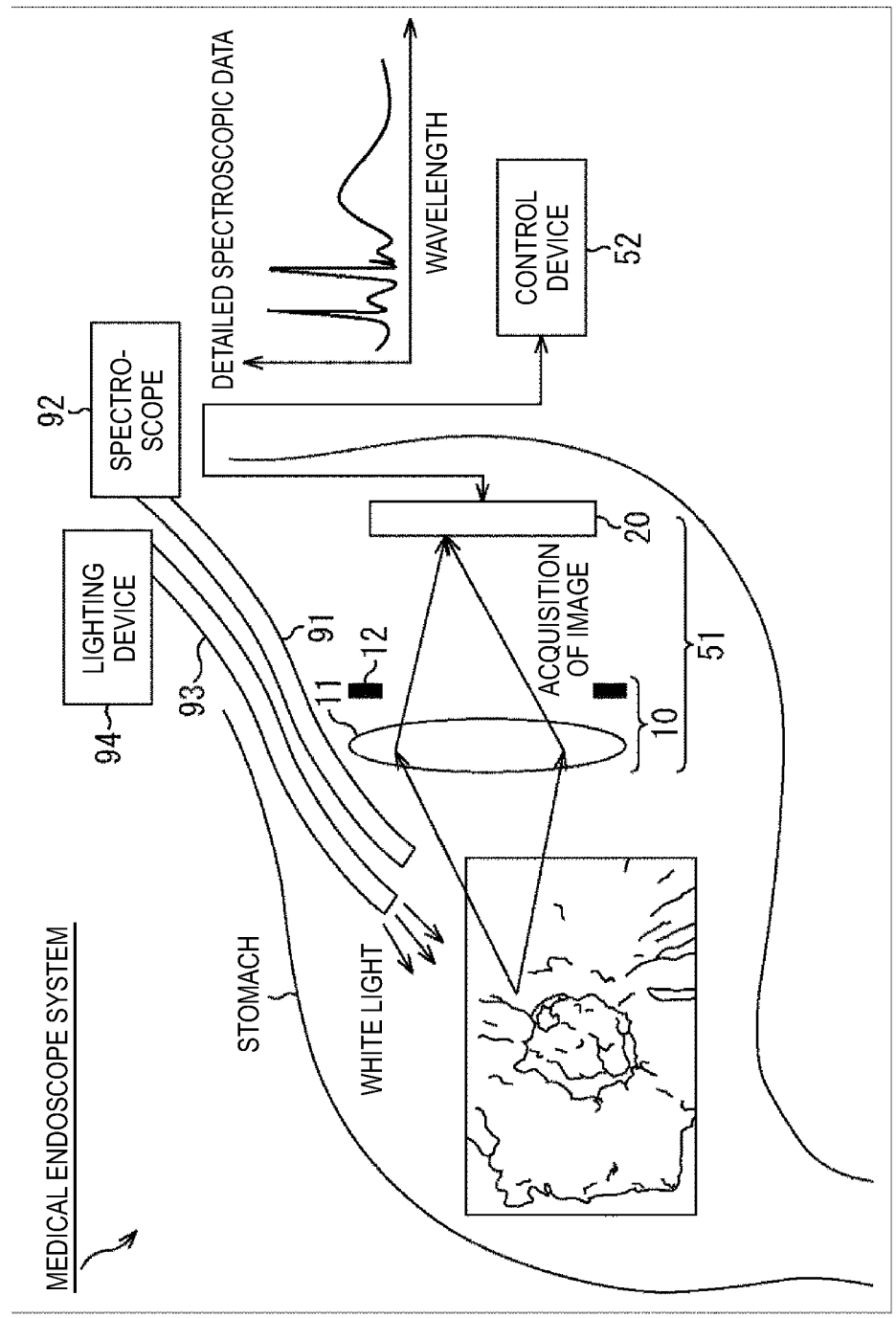
FIG. 12 is a diagram illustrating a second configuration example of the medical endoscope system which uses the imaging and light emitting system.

FIG. 12 is a diagram illustrating a second configuration example of the medical endoscope system which uses the imaging and light emitting system of FIG. 5.

It should be noted that the same reference numerals are given to portions corresponding to those of FIG. 11 in the drawing, and description thereof will hereinbelow be appropriately omitted.

The medical endoscope system is constituted by the imaging and light emitting device 51, the control device 52, the optical fiber 91, the spectroscope 92, another optical fiber 93, and a lighting device 94 in FIG. 12.

Thus, the medical endoscope system of FIG. 12 is the same as that of FIG. 11 in that the system has the imaging and light emitting device 51, the control device 52, the optical fiber 91, and the spectroscope 92, and is different from that of FIG. 11 in that the optical fiber 93 and the lighting device 94 are newly provided.

In FIG. 12, the imaging and light emitting device 51 and the optical fiber 91 are inserted into the stomach from the mouth or nose of a human body as in FIG. 11. Furthermore, in FIG. 12, the optical fiber 93 is inserted into the stomach from the mouth or nose of the human body.

The lighting device 94 includes, for example, a white light source or the like and thus emits light such as white light. Light emitted by the lighting device 94 is guided to the inside of the stomach by the optical fiber 93 to light the inside of the stomach.

In FIG. 12, (an image of) the inside of the stomach lit with light from the lighting device 94 as described above is captured by the imaging and light emitting device 51.

It should be noted that light of the lighting device 94 is turned on when capturing by the imaging and light emitting device 51 is performed, and when the light emitting units 41 provided in (the light receiving and emitting device 20 included in) the imaging and light emitting device 51 emit light for spectroscopic measurement, the light is turned off to make the inside of the stomach dark.

In addition, in FIG. 12, the inside of the stomach is lit by guiding the light of the lighting device 94 to the inside of the stomach using the optical fiber 93; however, alternatively, the inside of the stomach can be lit by employing a small lighting device, for example, an LED or the like as the lighting device 94 and inserting the small lighting device 94 into the stomach from the mouth or nose of the human body.

Figure 13:
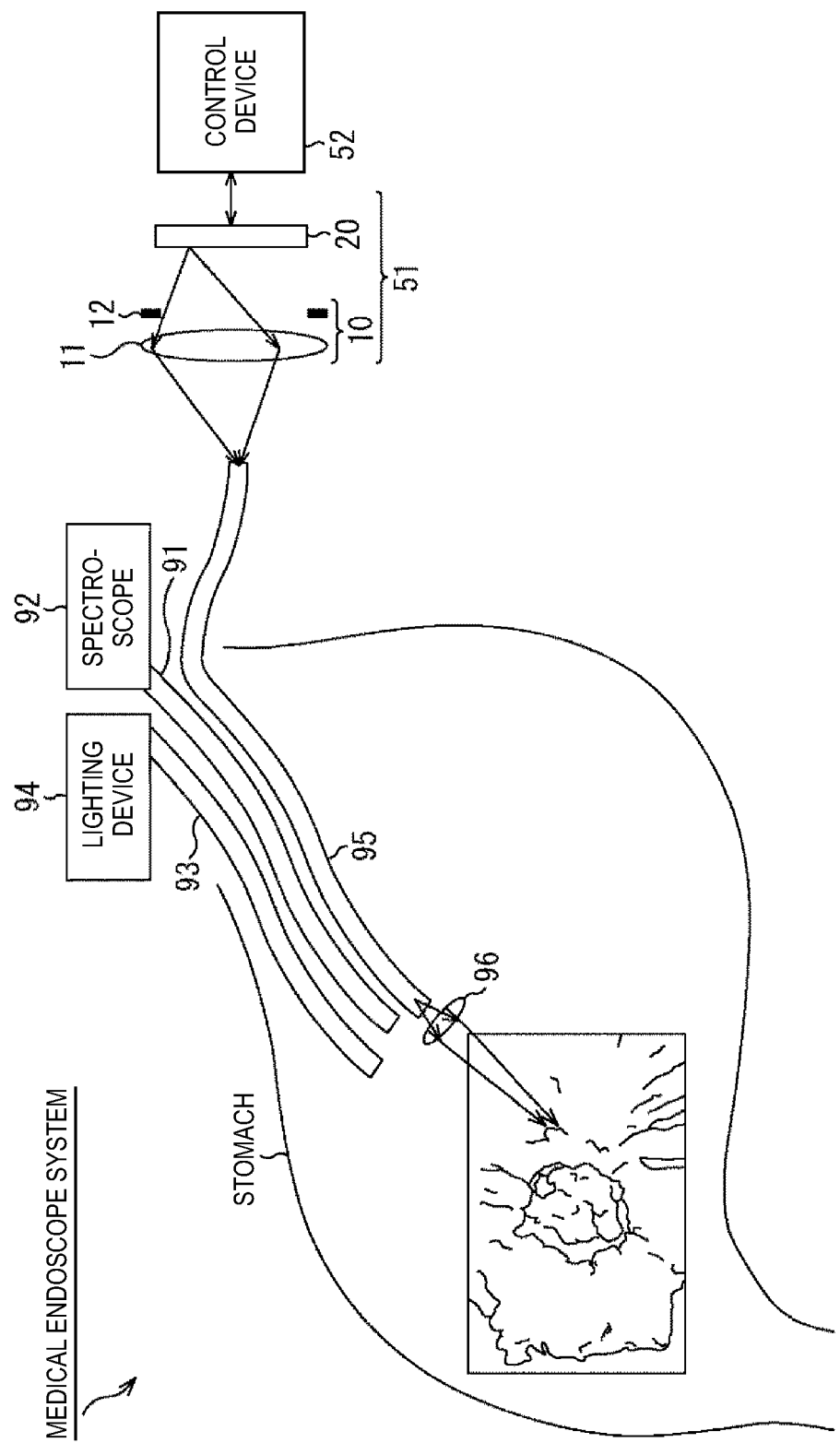
FIG. 13 is a diagram illustrating a third configuration example of the medical endoscope system which uses the imaging and light emitting system.

FIG. 13 is a diagram illustrating a third configuration example of the medical endoscope system which uses the imaging and light emitting system of FIG. 5.

It should be noted that the same reference numerals are given to portions corresponding to those of FIG. 11 or FIG. 12 in the drawing, and description thereof will hereinbelow be appropriately omitted.

The medical endoscope system of FIG. 13 is constituted by the imaging and light emitting device 51, the control device 52, the optical fiber 91, the spectroscope 92, the optical fiber 93, the lighting device 94, another optical fiber 95, and an imaging lens 96.

Thus, the medical endoscope system is the same as that of FIG. 12 in that the system has the imaging and light emitting device 51, the control device 52, the optical fiber 91, the spectroscope 92, the optical fiber 93, and the lighting device 94, and is different from the case of FIG. 12 in that the optical fiber 95 and the imaging lens 96 are newly provided in FIG. 13.

In FIG. 13, the optical fibers 91, 93, and 95 and the imaging lens 96 are inserted into the stomach from the mouth or nose of a human body.

Thus, in FIG. 13, the optical fiber 91 guides reflected light or the like generated at a specific position of the stomach to the spectroscope 92, and the spectroscope 92 obtains the optical spectrum of the reflected light or the like as described in FIG. 11.

In addition, in FIG. 13, the optical fiber 93 guides light of the lighting device 94 to the inside of the stomach at the time of capturing (an image of) the inside of the stomach by the imaging and light emitting device 51 to light the inside of the stomach as described in FIG. 12.

However, in FIG. 13, the imaging lens 96 is provided at an end on the inner side of the stomach of the optical fiber 95 inserted into the stomach, and the imaging optical system 10 of the imaging and light emitting device 51 is disposed at the other end on the outer side of the human body.

Thus, in FIG. 13, capturing of the inside of the stomach by the imaging and light emitting device 51 is performed by receiving (photoelectrically converting) the light from the inside of the stomach that has been incident through the imaging lens 96 and the optical fiber 95.

In addition, when a predetermined light emitting unit 41 of the imaging and light emitting device 51 emits light, the light emitted by the light emitting unit 41 is radiated to a specific position of the stomach through the optical fiber 95 and the imaging lens 96.

In FIG. 13, only members like the optical fibers 91, 93, and 95 and the imaging lens 96 which can be configured to be small (in terms of their diameters) may be inserted into the stomach without inserting the imaging and light emitting device 51 into the stomach, and thus a burden on the human body can be reduced in comparison to the case in which the imaging and light emitting device 51 is inserted into the stomach.

It should be noted that, in FIG. 13, the imaging lens 11 of the imaging optical system 10 can be replaced with the imaging lens 96, and in this case, the imaging lens 11 may not be provided.

Although the case in which spectroscopic measurement is performed as a medical test in the medical endoscope system has been described above, it is also possible to perform treatment or a surgical operation (operation) that is likely to affect a lesion of an organ of a human body or a medicine, a tool or the like present in the lesion by radiating light in the medical endoscope system.

It should be noted that, in the medical endoscope systems of FIGS. 11 to 13, light can be radiated only to a specific position of an organ, and thus no adverse effect is exerted on other positions.

Since both of capturing of an image and radiation of light to a desired position can be performed with a compact configuration of the imaging and light emitting system of FIG. 5, it can be used in various applications such as optical communication or a medical test of a human body as described above.

In other words, it is possible to easily realize a medical device such as a medical endoscope system which performs medical tests for acquiring the optical spectrum of reflected light or the like from a desired position by radiating light to the position, and treatment and surgical operations.

In addition, it is possible to easily realize a mobile terminal which performs optical communication with 1 or more mobile terminals without leaking information to the outside (or to others).

In addition, it is possible to easily realize an imaging device (a camera) which obtains, for example, distance information with regard to a distance to a subject reflected on the image and shape information with regard to a shape through capturing of an image.

<First Configuration Example of the Light Receiving and Emitting Device 20>

Figure 14:
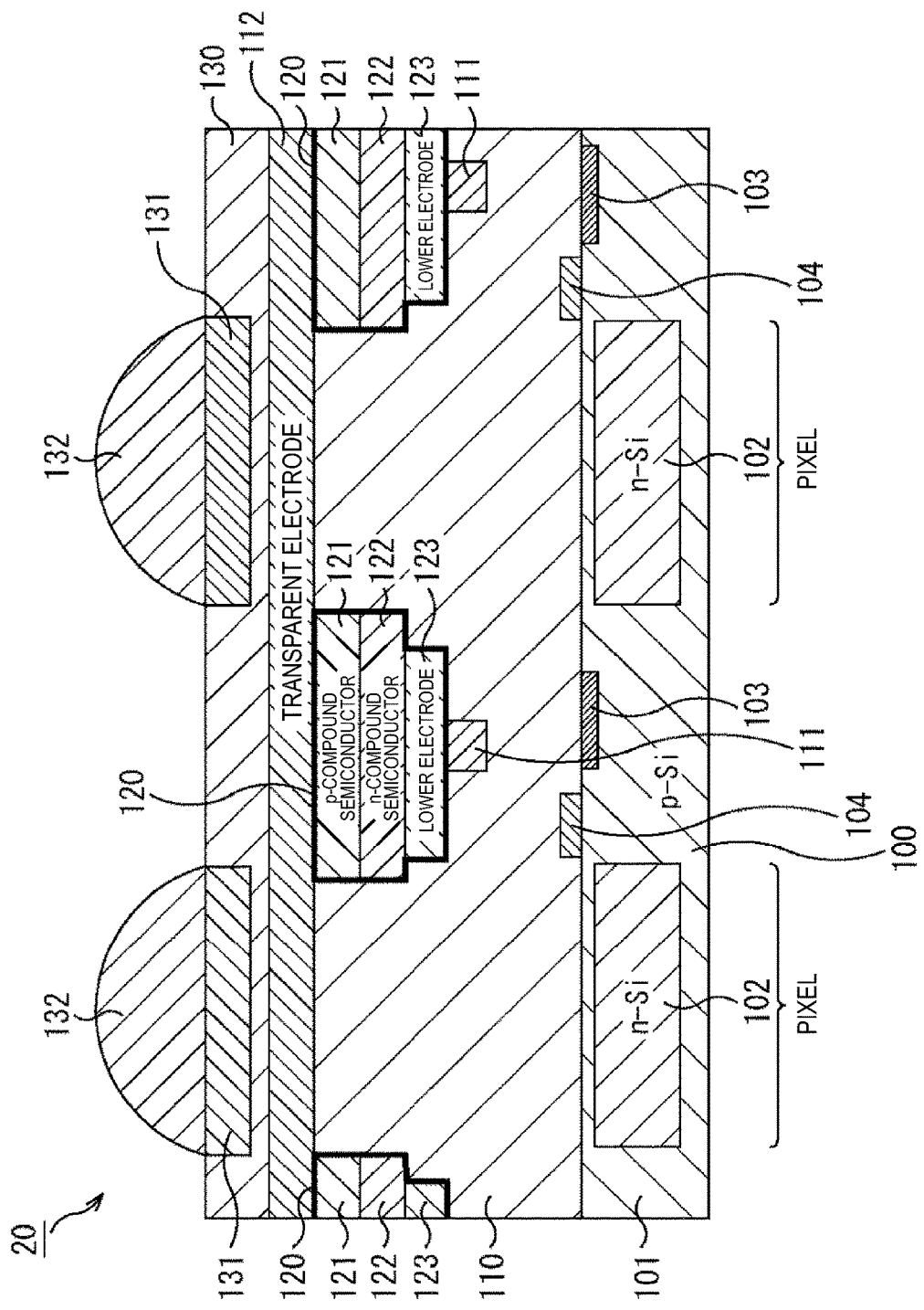
FIG. 14 is a cross-sectional diagram illustrating a first configuration example of the light receiving and emitting device 20 in detail.

FIG. 14 is a cross-sectional diagram illustrating a first configuration example of the light receiving and emitting device 20 of FIG. 1 in detail.

In FIG. 14, the light receiving and emitting device 20 is structured roughly by mounting compound semiconductors serving as light emitting units on a CMOS image sensor.

In other words, in FIG. 14, an image sensor unit 100 has the same configuration as the CMOS image sensor.

The image sensor unit 100 has a Si substrate 101 composed of p-type Si (silicon) (p-Si).

Inside the Si substrate 101, a plurality of n-Si small regions 102 that are small regions of n-type Si (n-Si) are formed in a lattice shape, and the n-Si small regions 102 constitute photo diodes (PDs) as pixels together with p-Si of the Si substrate 101.

Near the n-Si small regions 102, n-Si regions serving as floating diffusions (FDs) 103 are formed in the upper portion inside the Si substrate 101.

In addition, transfer transistors (gates of FETs) 104 are provided between the n-Si small regions 102 and FDs 103 near the regions on the surface (upper face) of the Si substrate 101.

Here, when PDs configured by the n-Si small regions 102 receive light incident from the upper side, electric charges are generated. The electric charges generated in (the PDs configured by) the n-Si small regions 102 are transferred to the FDs 103 when the transfer transistors 104 are turned on.

The electric charges transferred to the FDs 103 are read through, for example, a so-called amplifying transistor and selection transistor (not illustrated), converted into a corresponding voltage, and then output as a pixel value.

It should be noted that a driving circuit configured by a TFT or the like which drives light emitting units 120 to be described later is formed on the Si substrate 101, but illustration thereof is omitted in FIG. 14 in order to avoid complexity of the drawing.

An oxide film 110 is formed on the image sensor unit 100.

Wiring layers 111 and light emitting units 120 are provided in the upper portion inside the oxide film 110 (on the side on which light is incident on the PDs configured by the n-Si small regions 102).

The wiring layers 111 are wirings connected to the light emitting units 120, and provided in the lower part of the light emitting units 120 in FIG. 14.

Each of the light emitting units 120 is, for example, a light emitting unit configured with compound semiconductors, and has a p-n junction of a p-type compound semiconductor (p-compound semiconductor) 121 and an n-type compound semiconductor (n-compound semiconductor) 122. The light emitting unit 120 emits light when forward bias is applied thereto, in other words, when a higher voltage is applied to the p-type compound semiconductor 121 than to the n-type compound semiconductor 122 (a lower voltage is applied to the n-type compound semiconductor 122 than to the p-type compound semiconductor 121).

In each of the light emitting units 120 of FIG. 14, the p-type compound semiconductor 121 is disposed in the upper part and the n-type compound semiconductor 122 is disposed in the lower part. Furthermore, a lower electrode 123 is provided in a lower part of each n-type compound semiconductor 122, and each wiring layer 111 is provided in the lower part of the lower electrode 123.

Note that each of the light emitting units 120 is provided at a position at which it does not obstruct incidence of light on the n-Si small regions 102 such as between the n-Si small regions 102 which configure the PDs serving as pixels. In FIG. 14, the light emitting units 120 are provided above the FDs 103 but not above the PDs configured by the n-Si small regions 102.

In addition, the lower electrode 123 provided in the lower part of the n-compound semiconductor 122, i.e., the lower electrode 123 in the lower part of the light emitting unit 120 which is the side on which the light emitting unit faces the image sensor unit 100, also serves as a light blocking film which blocks light emitted by the light emitting unit 120 in order to prevent the light emitted by the light emitting unit 120 from leaking to the image sensor unit 100 side and becoming noise.

A transparent electrode (an electrode that is transparent) 112 serving as a common electrode is formed on the light emitting units 120, and another oxide film 130 is formed on the transparent electrode 112.

In addition, at positions of the oxide film 130 corresponding to the n-Si small regions 102 which configure the PDs serving as pixels, on-chip color filters (OCCFs) 131 for color separation of red (R), green (G), and blue (B) according to the Bayer array or the like are formed.

On-chip lenses (OCLs) 132 for collecting light are formed on the OCCFs 131.

In the light receiving and emitting device 20 configured as described above, light incident on the n-Si small regions 102 which configure the PDs serving as pixels via the OCLs 132, the OCCFs 131, the oxide film 130, the transparent electrode 112, and the oxide film 110 is photoelectrically converted, and thereby an image is captured.

In addition, as the light emitting units 120 emit light and the light emitted by the light emitting units 120 is output via the transparent electrode 112 and the oxide film 130, the light is radiated to a desired position.

It should be noted that, with regard to the oxide films 110 and 130, a nitride film or other transparent organic material can be employed instead of the oxide films 110 and 130.

Figure 15:
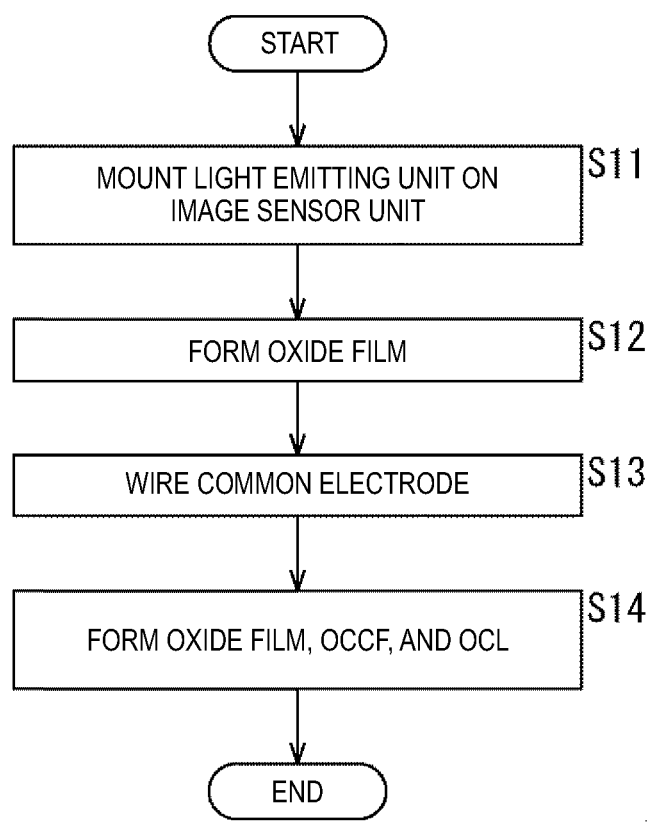
FIG. 15 is a flow chart describing an example of a manufacturing method of the light receiving and emitting device 20.

FIG. 15 is a flow chart describing an example of a manufacturing method of the light receiving and emitting device 20 of FIG. 14.

It should be noted that, in manufacturing of the light receiving and emitting device 20 of FIG. 14, the image sensor unit 100 and the light emitting units 120 are manufactured in advance in a semiconductor process. In addition, during manufacturing of the image sensor unit 100, the driving circuit which drives the light emitting units 120 described above is also formed on the image sensor unit 100.

In Step S11, the wiring layers 111 are formed above the image sensor unit 100 to mount the light emitting units 120 using soldering, and in Step S12, the oxide film 110 is formed.

Further, in Step S13, by depositing an indium tin oxide (ITO) electrode using a sputtering method, for example, a wire of the transparent electrode 112 which serves as a common electrode is formed.

In addition, in Step S14, the oxide film 130, the OCCFs 131, and the OCLs 132 are formed, and thereby the manufacturing of the light receiving and emitting device 20 is completed.

It should be noted that, as the transparent electrode 112, an electrode of any structure among a sheet-like electrode and a linear electrode may be employed.

In addition, although an ITO electrode is employed as the transparent electrode 112 in FIG. 15, a structure or material of the transparent electrode 112 is not particularly limited as long as it is a structure or a material with which light from above is incident on the n-Si small regions 102 which configure the PDs serving as pixels of the image sensor unit 100.

Moreover, it is not necessary to provide the OCCFs 131 and the OCLs 132.

Figure 16:
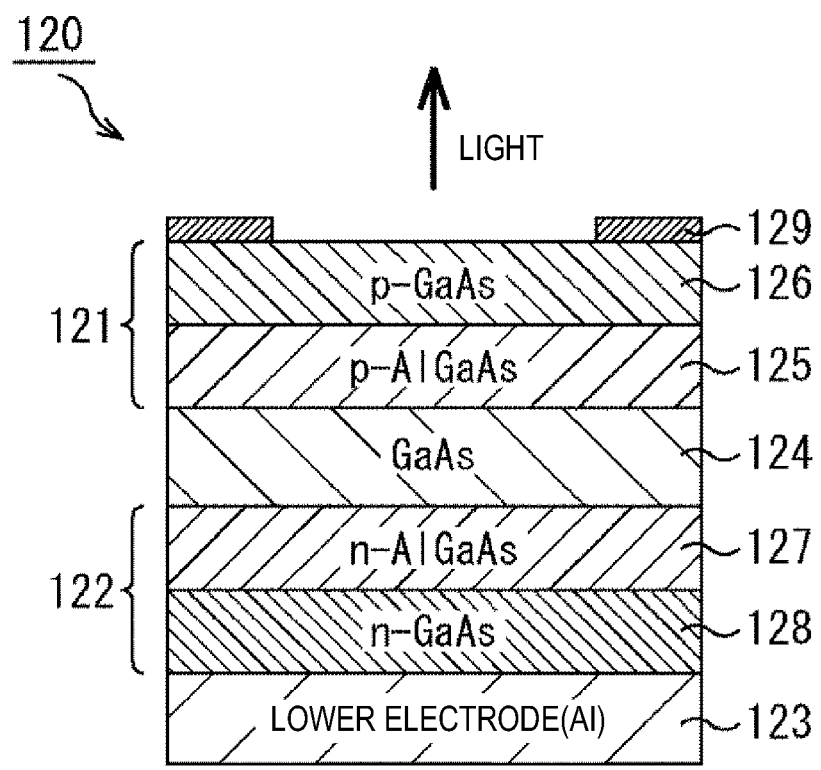
FIG. 16 is a cross-sectional diagram illustrating a configuration example of a light emitting unit 120.

FIG. 16 is a cross-sectional diagram illustrating a configuration example of the light emitting unit 120 of FIG. 14.

As described in FIG. 14, the light emitting unit 120 is configured with compound semiconductors, and has a p-n junction of the p-compound semiconductor 121 and the n-compound semiconductor 122.

In FIG. 14, as the compound semiconductors, for example, AlGaAs-based materials are employed, and a light emitting layer 124 of GaAs is provided in the portion of the p-n junction by the p-compound semiconductor 121 and the n-compound semiconductor 122.

In addition, the light emitting unit 120 has a double heterostructure in which the upper and lower parts of the light emitting layer 124 are sandwiched by a p-AlGaAs layer 125 and an n-AlGaAs layer 127.

Furthermore, a p-GaAs contact layer 126 is formed on the p-AlGaAs layer 125, and an n-GaAs contact layer 128 is formed below the n-AlGaAs layer 127.

On the p-GaAs contact layer 126, an upper electrode 129 is formed using Ti, Pt, Au, or the like in peripheral portions of the contact layer 126. In addition, below the n-GaAs contact layer 128, the lower electrode 123 that is connected to the wiring layer 111 (of FIG. 14) is formed using Al or the like.

Here, in the light emitting unit 120, Se and Zn can be employed respectively as n-type and p-type dopants.

In addition, in FIG. 16, the p-AlGaAs layer 125 and the p-GaAs contact layer 126 constitute the p-compound semiconductor 121, and the n-AlGaAs layer 127 and the n-GaAs contact layer 128 constitute the n-compound semiconductor 122.

In the light emitting unit 120 configured as described above, when forward bias is applied (when a higher voltage is applied to the p-compound semiconductor 121 side than to the n-compound semiconductor 122 side), the light emitting layer 124 emits light due to recombination of electrons and holes, and light from the light emission is output from the center portion of the p-GaAs contact layer 126 in which the upper electrode 129 is not formed.

Figure 17:
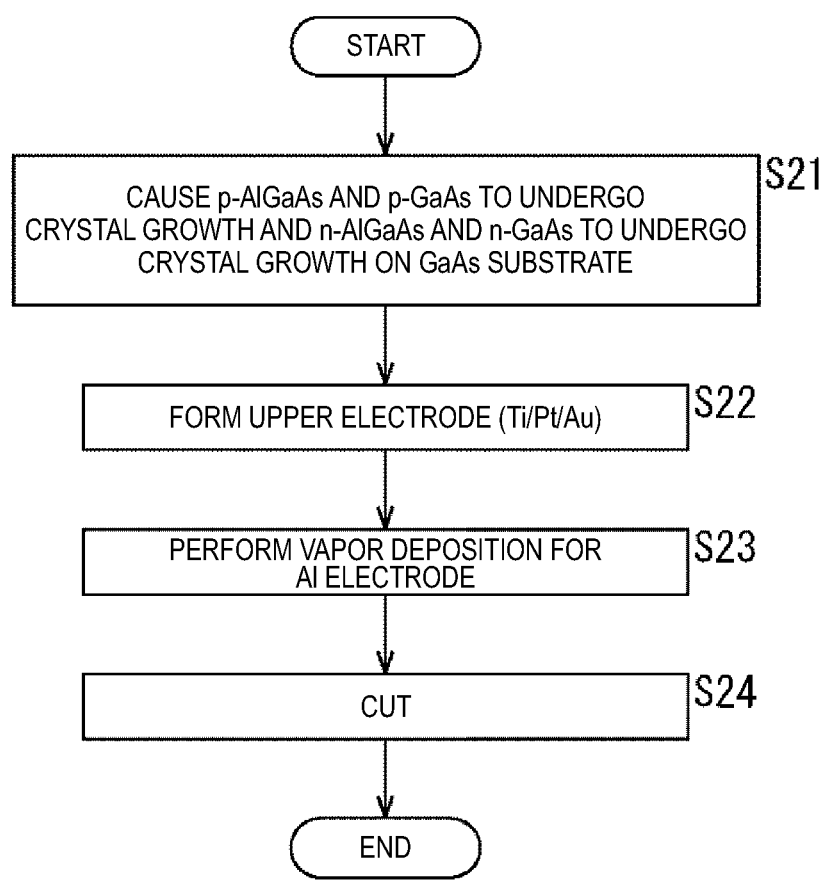
FIG. 17 is a flow chart describing an example of a manufacturing method for manufacturing the light emitting unit 120.

FIG. 17 is a flow chart describing an example of a manufacturing method for manufacturing the light emitting unit 120 of FIG. 16.

In Step S21, on a GaAs substrate which serves as the light emitting layer 124, the p-AlGaAs layer 125, the n-AlGaAs layer 127, and further the p-GaAs contact layer 126, and the n-GaAs contact layer 128 are formed through epitaxial crystal growth using, for example, a metal organic chemical vapor deposition (MOCVD) method, a molecular beam epitaxy (MBE) method, or the like.

In Step S22, the upper electrode 129 made of Ti, Pt, or Au is formed on the p-GaAs contact layer 126 using an electron beam vapor deposition method.

Further, in Step S23, a thin film is formed using Al below the n-GaAs contact layer 128 through vapor deposition using a resistance heating method or the like to form the lower electrode 123.

Then, in Step S24, a light emitting unit 120 of a desired size is cut out from the portion of the GaAs substrate in which the p-AlGaAs layer 125, the n-AlGaAs layer 127, the p-GaAs contact layer 126, and the n-GaAs contact layer 128 are crystal-grown and then the upper electrode 129 and the lower electrode 123 are formed using a cleaving method, a dicing method, or the like, and thereby the manufacturing of the light emitting unit 120 is completed.

Here, if the size of a pixel (n-Si small region 102) of the image sensor unit 100 is assumed to be, for example, 10 square μm, for example, 5 square μm can be employed as the size of the light emitting unit 120. However, the size of the light emitting unit 120 is not particularly limited.

In addition, as a method of crystal growth, a liquid phase epitaxy (LPE) method, and other arbitrary methods can be employed in addition to the MOCVD method and the MBE method.

Furthermore, the upper electrode 129 formed of Ti, Pt, or Au is set to be an ohmic electrode; however, the upper electrode 129 is not particularly limited as long as it is an electrode having an ohmic property or an electrode equivalent thereto.

It should be noted that, in FIG. 16, as the compound semiconductor constituting the light emitting unit 120, the AlGaAs-based material is employed; however, in addition to that, a group III-V (3-5) compound, a group II-VI (2-6) compound, a group I-III-VI (1-3-6) compound, for example, an AlGaInN-based, GaInNAs-based, AlGaInP-based, AlGaAs-based, GaAsInP-based, MgZnCdSSe-based, or CuInGaSSe-based compound, a compound semiconductor material which contains quantum dots or a quantum well of these, or the like can be employed as a compound semiconductor.

When an AlGaInN-based material is employed as the compound semiconductor constituting the light emitting unit 120, for example, the light emitting unit 120 has a double heterostructure in which GaInN is used in the light emitting layer and the upper and lower parts thereof is sandwiched by p-type and n-type AlGaN layers.

When an AlGaInP-based material is employed as the compound semiconductor constituting the light emitting unit 120, for example, the light emitting unit 120 has a double heterostructure in which GaInP is used in the light emitting layer and the upper and lower parts thereof are sandwiched by p-type and n-type AlGaInP layers.

When a MgZnCdS Se-based material is employed as the compound semiconductor constituting the light emitting unit 120, for example, the light emitting unit 120 has a double heterostructure in which ZnCdSe is used in the light emitting layer and the upper and lower parts thereof are sandwiched by p-type and n-type MgZnSSe layers.

The structure of the light emitting unit 120 described above is an LED structure; however, as a structure of the light emitting unit 120, for example, a surface-emitting laser structure can be employed.

Figure 18:
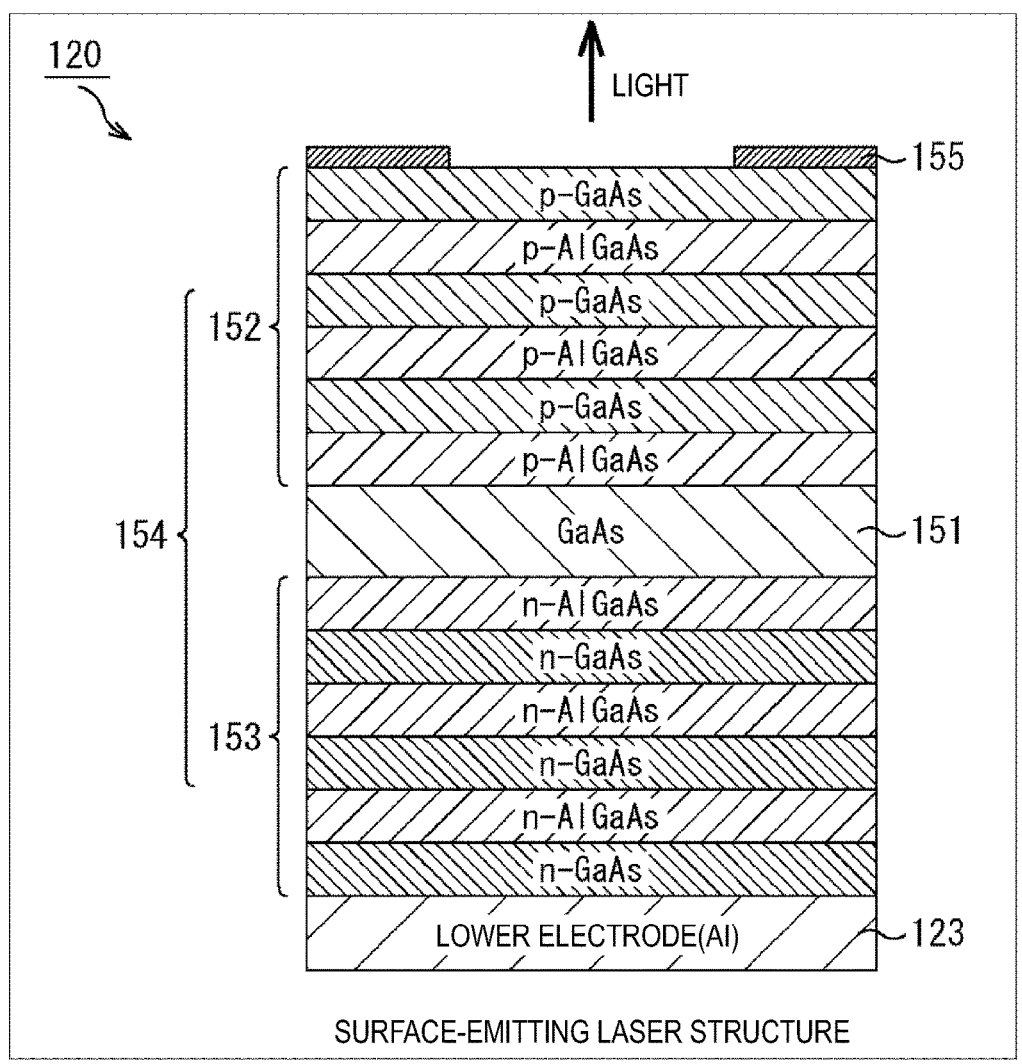
FIG. 18 is a cross-sectional diagram illustrating another configuration example of the light emitting unit 120.

FIG. 18 is a cross-sectional diagram illustrating another configuration example of the light emitting unit 120 of FIG. 14.

The light emitting unit 120 of FIG. 18 forms a surface-emitting laser in which a resonator is constituted in the perpendicular direction with respect to a substrate using multilayer reflectors (distributed Bragg reflectors; DBR) made of AlGaAs and GaAs.

In other words, in FIG. 18, the multilayer reflector 152 in which p-AlGaAs and p-GaAs are stacked in a layer form is formed on a GaAs substrate 151, and the multilayer reflector 153 in which n-AlGaAs and n-GaAs are stacked in a layer form is formed below the GaAs substrate 151.

Then, the resonator 154 is constituted by the multilayer reflectors 152 and 153.

On the multilayer reflector 152, an upper electrode 155 made of Ti, Pt, Au, or the like is formed in the peripheral portion of the multilayer reflector 152. In addition, below the multilayer reflector 153, a lower electrode 123 connected to the wiring layer 111 (of FIG. 14) is formed using Al or the like.

In the light emitting unit 120 configured as described above, light obtained through stimulated emission is reflected in the resonator 154, thereby becoming laser light having phases, and then output from the center portion of the upper portion of the multilayer reflector 152 in which the upper electrode 155 is not formed.

It should be noted that the light emitting unit 120 of the surface-emitting laser structure can be constituted using materials other than AlGaAs and GaAs.

<Method of Crystal Growth>

Figure 19:
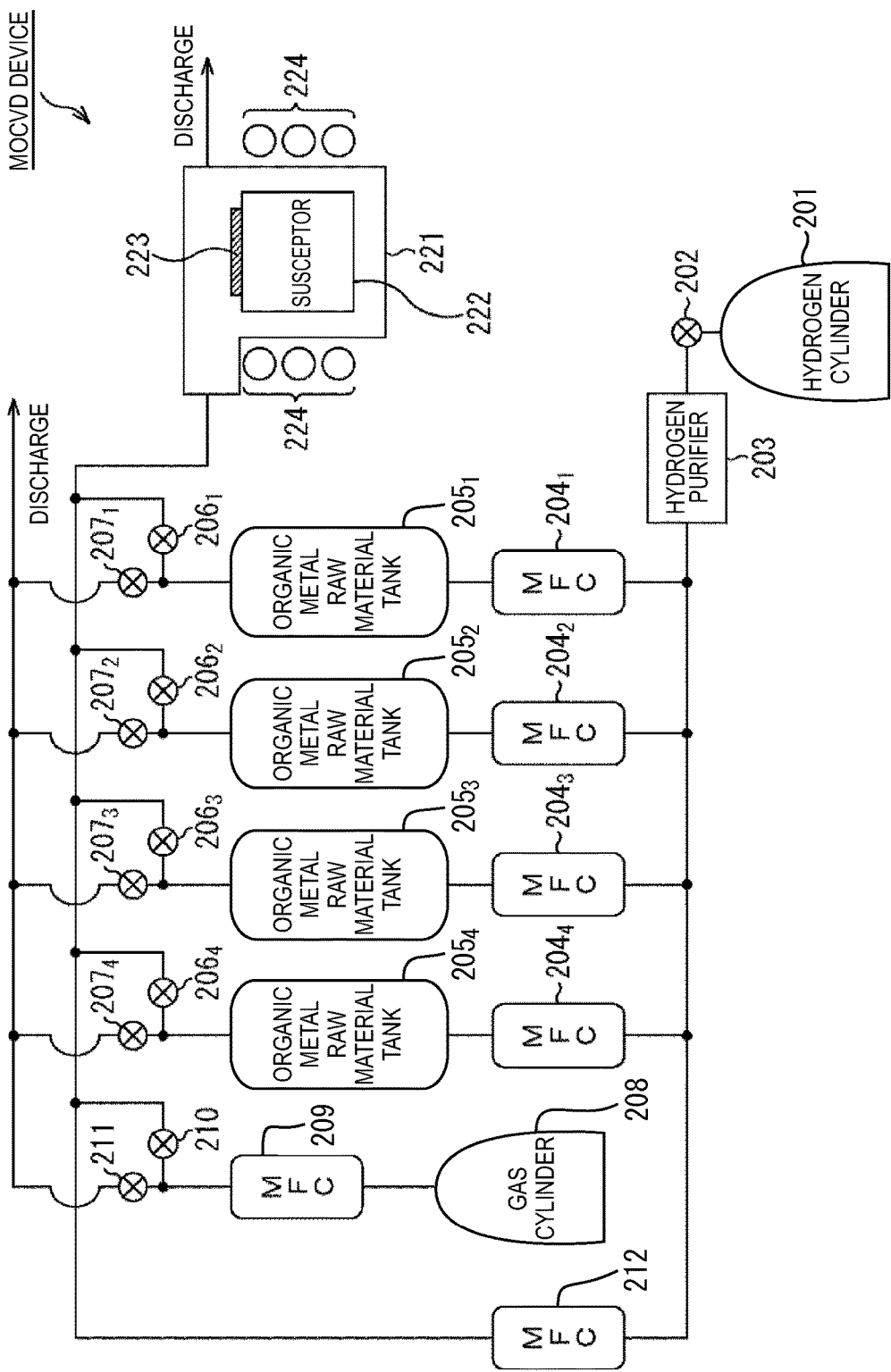
FIG. 19 is a block diagram illustrating a configuration example of an MOCVD device which performs crystal growth using an MOCVD method.

FIG. 19 is a block diagram illustrating a configuration example of an MOCVD device which performs crystal growth using the MOCVD method.

As described in FIG. 17, for example, crystal growth is performed in the light emitting layer 124 during manufacturing of the light emitting unit 120 of FIG. 16.

FIG. 19 illustrates the configuration example of the MOCVD device which performs crystal growth using the MOCVD method.

When crystal growth is performed using the MOCVD method, for example, the following organic metals are used.

Specifically, as an organic metal of copper, for example, copper acetylacetonate ($Cu(C_5H_7O_2)_2$), or cyclopentadienyl copper triethylene ($h5\text{-}(C_2H_5)Cu:P(C_2H_5)_3$) is used.

As an organic metal of gallium (Ga), for example, trimethylgallium ($Ga(CH_3)_3$) is used, and as an organic metal of aluminum (Al), for example, trimethyaluminum ($Al(Ch_3)_3$) is used.

As an organic metal of indium (In), for example, trimethylindium ($In(Ch_3)_3$) is used, and as an organic metal of selenium (Se), for example, dimethylselenium ($Se(CH_3)_2$) is used.

As an organic metal of sulfur (S), for example, dimethylsulfide ($S(CH_3)_2$) is used, and as an organic metal of zinc (Zn), for example, dimethylzinc ($Zn(CH_3)_2$) is used.

As a group V material, for example, arsine ($AsH_3$), phosphine ($PH_3$), or ammonia ($NH_3$) is used.

In the MOCVD device, an organic metal raw material in an organic metal raw material tank $205_i$ (i=1, 2, 3, and 4 in FIG. 19) is caused to bubble with hydrogen serving as a carrier gas to be in a saturated vapor pressure state, and then molecules of each of the organic metal raw materials are transported to a reaction tube 221 via a valve $206_i$.

The hydrogen serving as a carrier gas is supplied from a hydrogen cylinder 201 to a mass flow controller (MFC) $204_i$ via a valve 202 and a hydrogen purifier 203.

The MFC $204_i$ controls a flow rate of hydrogen flowing to the organic metal raw material tank $205_i$, and thereby a molar quantity of the molecules of each of the organic metal raw materials transported to the reaction tube 221 per unit time is decided.

It should be noted that a gas material in a gaseous form is transported from a gas cylinder 208 to the reaction tube 221 via an MFC 209 and a valve 210, and hydrogen serving as a carrier gas is transported from the hydrogen cylinder 201 to the reaction tube 221 via the valve 202, the hydrogen purifier 203, and an MFC 212 when necessary.

In addition, an organic metal raw material is discharged via a valve $207_i$ and a gas raw material is discharge via a valve 211.

A substrate 223 on which crystal growth is performed is installed on a susceptor 222 made of carbon or the like inside the reaction tube 221, and the susceptor 222 is heated by a radio frequency (RF) coil (high-frequency heating device) 224.

Crystal growth occurs when an organic metal raw material (and the necessary gas raw material) transported to the reaction tube 221 is thermally decomposed on the substrate 223 installed on the susceptor 222 and then incorporated into a crystal.

Here, since a molar quantity ratio of the organic metal raw material transported to the reaction tube 221 (transported molar quantity ratio) and a composition ratio of the crystal have a correlation, it is possible to control the composition ratio of the crystal using the correlation.

In addition, although not illustrated, the MOCVD device of FIG. 19 is provided with a temperature control mechanism which controls (a current flowing in) the RF coil 224 based on a thermocouple and a temperature of the substrate 223 measured by the thermocouple so that a temperature of the substrate 223 heated by the RF coil 224 is controlled.

The temperature of the substrate 223 is generally controlled in the range of about 400 to 1000 degrees at which thermal decomposition of an organic metal raw material is possible, but in order to lower the temperature of the substrate 223, it is possible to assist thermal decomposition of an organic metal raw material by radiating light onto the surface of the substrate 223 using, for example, a mercury lamp or the like.

It should be noted that a raw material in a solid state at room temperature such as cyclopentadienyl copper triethylene (h5-$(C_2H_5)Cu:P(C_2H_5)_3$), copper acetylacetonate (Cu $(C_5H_7O_2))_2$), trimethylindium (In$(CH_3)_3$), or the like can be used in a liquid state obtained by heating the raw material or in the solid state in which the temperature is simply raised to raise vapor pressure.

Figure 20:
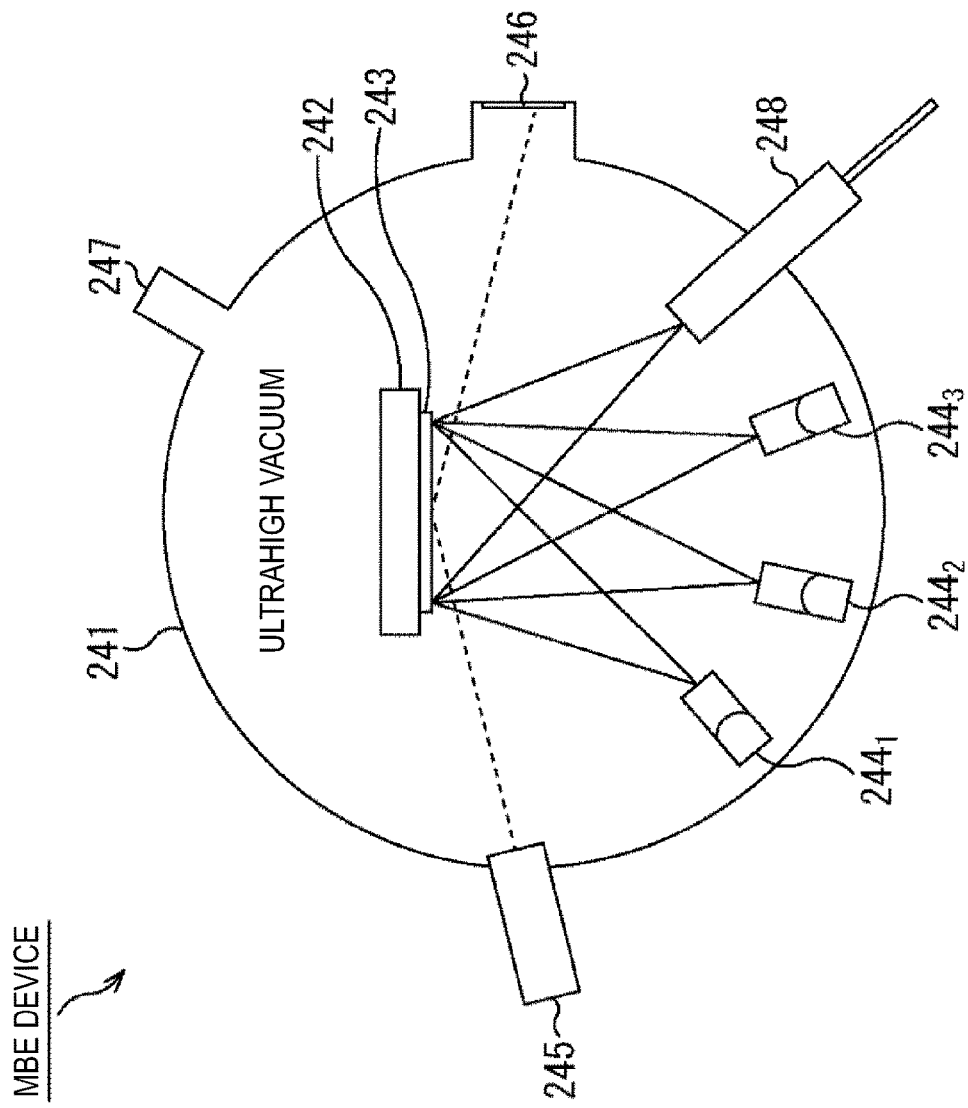
FIG. 20 is a block diagram illustrating a configuration example of an MBE device which performs crystal growth using an MBE method.

FIG. 20 is a block diagram illustrating a configuration example of an MBE device which performs crystal growth using the MBE method.

In the MBE device, a substrate 243 is mounted on a substrate holder 242 installed in a chamber 241, and the inside of the chamber 241 is set to be in an ultrahigh vacuum state.

Then, in the MBE device, each single raw material, for example, copper (Cu), magnesium (Mg), zinc (Zn), gallium (Ga), aluminum (Al), indium (In), selenium (Se), and sulfur (S), and the like is input into each Knudsen cell $244_i$ (i=1, 2, and 3 in FIG. 20) to be heated to a proper temperature, and a molecular beam of each single raw material is radiated onto the substrate 243 to perform crystal growth.

It should be noted that, since stability of the size of the molecular beam of a raw material such as sulfur (S), whose vapor pressure is particularly high, is insufficient, the size of the molecular beam can be stabilized using a valved cracking cell that is not illustrated.

In addition, for some raw materials, a gas source that is made into a gas using a method of forming an organic compound or the like, as in gas source MBE, can be employed.

For example, ammonia ($NH_3$) or the like as a raw material of N, hydrogen selenide ($H_2Se$) or the like as a raw material of Se, or hydrogen sulfide ($H_2S$) or the like as a raw material of sulfur (S) can be employed.

For the gas source, crystal growth can be performed with high efficiency using a plasma cell 248.

Here, in the MBE device of FIG. 20, a reflection high-energy electron diffraction (RHEED) electron gun 245 radiates an electron beam onto the substrate 243, and a fluorescent screen 246 projects a diffraction image of the electron beam radiated onto the substrate 243 by the RHEED electron gun 245. Accordingly, crystal growth on the substrate 243 can be observed.

In addition, a quadrupole mass spectrometer (QMS) 247 analyzes the surface of the substrate 243.

It should be noted that, since crystal growth is performed in the MBE device at a low temperature, crystal growth can be performed on the substrate 243 while light is radiated thereto. For example, crystal growth can be performed while light is radiated onto a crystal-grown surface of the substrate 243 using a mercury high-pressure lamp or the like.

<Second Configuration Example of the Light Receiving and Emitting Device 20>

Figure 21:
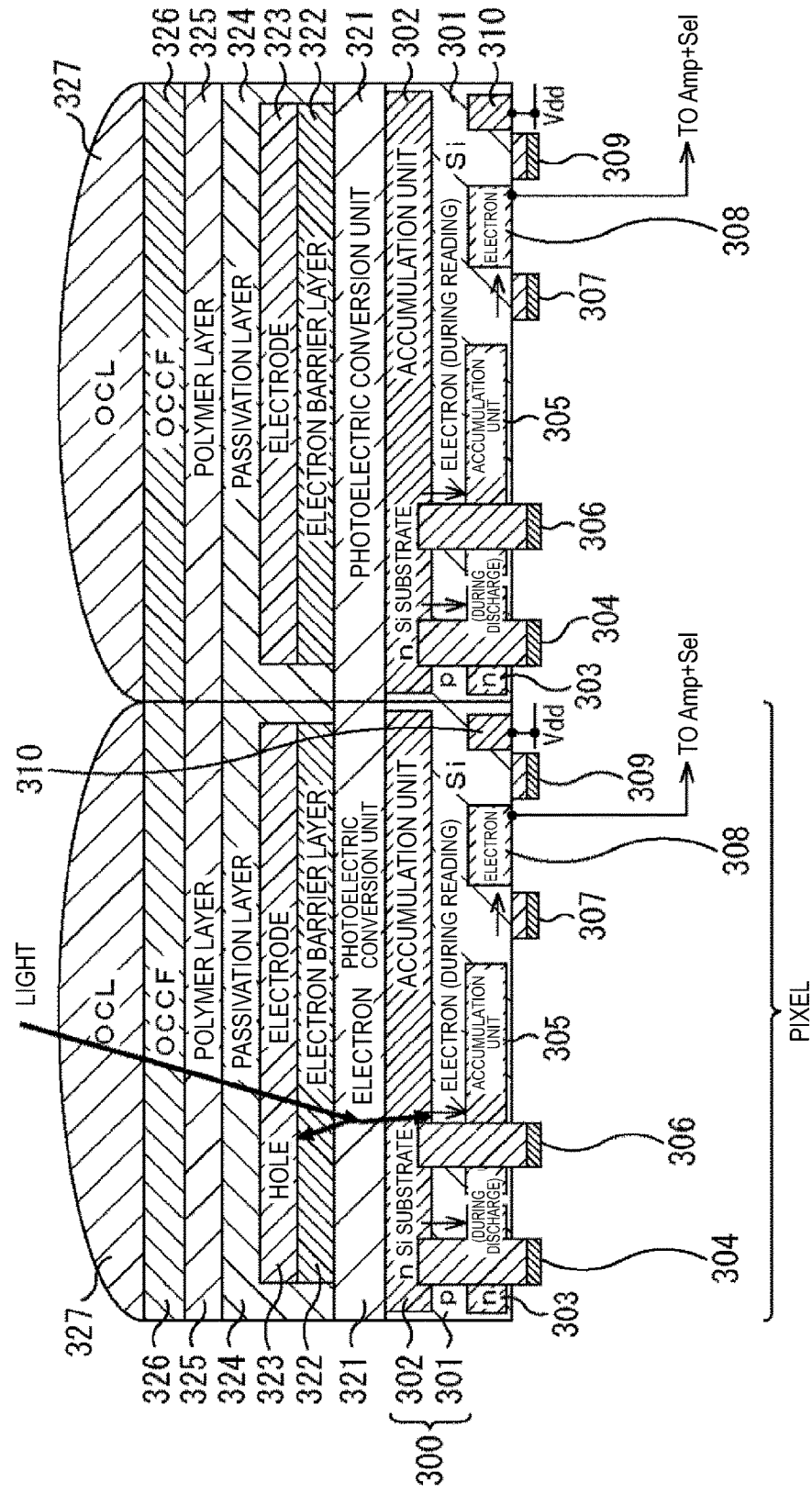
FIG. 21 is a cross-sectional diagram illustrating a second configuration example of the light receiving and emitting device 20 in detail.

FIG. 21 is a cross-sectional diagram illustrating a second configuration example of the light receiving and emitting device 20 of FIG. 1 in detail.

The light receiving and emitting device 20 of FIG. 14 is configured to separately have the light emitting units 120 which emit light and pixels which receive light; however, the light receiving and emitting device 20 of FIG. 21 is configured to have light emitting units which emit light and pixels which receive light in an integrated manner.

In FIG. 21, a reading unit 300 reads electrons generated in a photoelectric conversion unit 321 to be described later.

In other words, the reading unit 300 is constituted by a p-type Si substrate 301. On the p-type Si substrate 301, an n-type Si substrate (accumulation unit) 302 which serves as a plurality of portions equivalent to pixels and light emitting units is disposed in a lattice shape.

The n-type Si substrate 302 is an n-type region of an n-type semiconductor for reading electrons generated in the photoelectric conversion unit 321, and accumulating the electrons generated in the photoelectric conversion unit 321.

A Si region 303 that is an n-type Si region to which electrons accumulated in the Si substrate 302 are discharged is formed at the position in a lower part inside the p-type Si substrate 301 which corresponds to the left end of the n-type Si substrate 302 corresponding to a pixel.

A vertical transistor 304 is a transistor which connects the Si substrate 302 and the Si region 303 in the vertical (perpendicular) direction, and when the vertical transistor 304 is on, electrons accumulated in the n-type Si substrate 302 are transferred to the n-type Si region 303. The electrons transferred to the Si region 303 are discharged to, for example, a power source Vdd.

A Si region (accumulation unit) 305 that is an n-type Si region for reading electrons accumulated in the n-type Si substrate 302 is formed on the right side of the n-type Si region 303 in a lower part inside the p-type Si substrate 301.

A vertical transistor 306 is a transistor which connects the Si substrate 302 and the Si region 305 in the vertical direction, and when the vertical transistor 306 is on, electrons accumulated in the n-type Si substrate 302 are transferred to and accumulated in the n-type Si region 305.

An n-type Si region which serves as an FD 308 is formed on the right side of the n-type Si region 305 in a lower part inside the p-type Si substrate 301.

In addition, an MOS gate (transfer transistor) 307 is provided between the Si region 305 and the FD 308 on a rear surface (surface of the lower side) of the p-type Si substrate 301.

When the MOS gate 307 is on, electrons accumulated in the Si region 305 are transferred to the FD 308.

Electric charges transferred to the FD 308 are read through, for example, an amplifying transistor (Amp) and a selection transistor (Sel), none of which is illustrated, to be converted into a corresponding voltage, and output as a pixel value. A Si region 310 that is an n-type Si region is formed on the right side of the FD 308 in a lower part inside the p-type Si substrate 301. The Si region 310 is connected to the power source Vdd.

A MOS gate (reset transistor) 309 is provided between the FD 308 and the Si region 310 on the rear surface of the p-type Si substrate 301.

When the MOS gate 309 is on, the FD 308 is connected via the Si region 310 to the power source Vdd that is connected to the Si region 310 to be reset.

In the reading unit 300 configured as described above, electrons generated in the photoelectric conversion unit 321 are read by and accumulated in the Si substrate 302.

In addition, when the vertical transistor 306 is on, electrons accumulated in the Si substrate 302 are transferred to and accumulated in the Si region 305, and when the MOS gate 307 is on, the electrons accumulated in the Si region 305 are transferred to the FD 308.

The electric charges transferred to the FD 308 are read through, for example, the amplifying transistor (Amp) and the selection transistor (Sel), none of which is illustrated, to be converted into a corresponding voltage, and output as a pixel value.

The photoelectric conversion unit (film) 321 is formed in the upper part of the reading unit 300 (on the side on which light is incident) in a thickness of, for example, 1000 nm The photoelectric conversion unit 321 is, for example, a chalcopyrite-based compound semiconductor composed of a copper-gallium-indium-sulfur (hereinafter referred to as CuGaInS)-based mixed crystal that is lattice-matched with the n-type Si substrate 302, and can be formed through crystal growth using, for example, the MOCVD method, MBE method, or the like.

Here, the lattice-matched photoelectric conversion unit 321 with no crystal defect can be formed particularly with a compound semiconductor in which, for example, a composition ratio of Cu is 0.25, a composition ratio of In is 0.12, a composition ratio of Ga is 0.13, and a composition ratio of S is 0.5 having variations of the respective composition ratios in the range of ±10%.

As the photoelectric conversion unit 321, a chalcopyrite-based compound semiconductor composed of, for example, copper-aluminum-gallium-indium-sulfur-selenium (hereinafter referred to as CuAlGaInSSe)-based mixed crystal, and other direct-transition-type p-type semiconductor can be employed, in addition to the CuGaInS-based mixed crystal.

An electron barrier layer 322 is formed on the photoelectric conversion unit 321 in a lattice shape to correspond to the Si substrate 302 serving as the portions equivalent to pixels.

As the electron barrier layer 322, for example, a material with transparency, for example, NiO or the like which serves as a barrier to entry of electrons from the photoelectric conversion unit 321, can be employed. The electron barrier layer 322 can be formed to a thickness of, for example, 10 nm.

An electrode 323 is formed in the upper part of the electron barrier layer 322 to a thickness of, for example, 100 nm.

The electrode 323 is, for example, a p-type electrode having transparency, and as the electrode 323, for example, a transparent electrode material such as ITO can be employed.

In order to protect the electrode 323, the electron barrier layer 322, and the photoelectric conversion unit 321, a passivation layer 324 is formed in the upper parts of the electrode 323 to cover the electrode 323, the electron barrier layer 322, and the photoelectric conversion unit 321.

As the passivation layer 324, for example, SiN can be employed.

A polymer layer 325 for flattening is formed in the upper part of the passivation layer 324.

An OCCF 326 is formed in the upper part of the polymer layer 325, and an OCL 327 is formed in the upper part of the OCCF 326.

In the light receiving and emitting device 20 configured as described above, because the photoelectric conversion unit 321 formed with the chalcopyrite-based compound semiconductor composed of a CuGaInS-based mixed crystal includes a p-type semiconductor material, it forms a p-n junction in the junctions with the n-type Si substrate 302.

In addition, since the photoelectric conversion unit 321 formed of the chalcopyrite-based compound semiconductors composed of a CuGaInS-based mixed crystal is of a direct transition type, the unit emits light through recombination.

Furthermore, the photoelectric conversion unit 321 formed of the chalcopyrite-based compound semiconductor composed of CuGaInS-based mixed crystal receives light incident through the OCL 327, the OCCF 326, the polymer layer 325, the passivation layer 324, the electrode 323, and the electron barrier layer 322, and then performs photoelectric conversion generating holes and electrons according to the amount of light.

In addition, when reverse bias is applied to the p-n junction of the photoelectric conversion unit 321 and the Si substrate 302, in other words, when a lower voltage is applied to the p-type photoelectric conversion unit 321 than to the n-type Si substrate 302, electrons among the electrons and holes generated through the photoelectric conversion of the photoelectric conversion unit 321 are quickly read on the Si substrate 302 side of the reading unit 300 due to the electric field caused by the reverse bias, and then output as a pixel value as described above.

On the other hand, the holes among the electrons and holes generated through the photoelectric conversion of the photoelectric conversion unit 321 are quickly discharged to the electrode 323 via the electron barrier layer 322 due to the electric field caused by the reverse bias.

Thus, the photoelectric conversion unit 321 functions as a pixel which receives light and performs photoelectric conversion through which an electric signal corresponding to the amount of the light is output during application of reverse bias.

When forward bias is applied to the p-n junction of the photoelectric conversion unit 321 and the Si substrate 302, in other words, when a higher voltage is applied to the p-type photoelectric conversion unit 321 than to the n-type Si substrate 302, electrons are injected from the Si substrate 302 to the photoelectric conversion unit 321, and at the same time, holes are injected from the electrode 323 to the photoelectric conversion unit 321 via the electron barrier layer 322.

Due to injection of the electrons and holes, recombination of electrons and holes occurs in the photoelectric conversion unit 321, and thereby the photoelectric conversion unit 321 emits light.

Thus, the photoelectric conversion unit 321 functions as a light emitting unit which emits light during application of forward bias.

As described above, in the light receiving and emitting device 20 of FIG. 21, only by changing the direction of bias applied to the p-n junction of the photoelectric conversion unit 321 and the Si substrate 302, the photoelectric conversion unit 321 can be caused to function as a pixel or light emitting unit, and thus the light receiving and emitting device 20 can be configured in a smaller size at a lower cost than when pixels and light receiving units are configured separately.

It should be noted that, during application of reverse bias, the electron barrier layer 322 serves as a barrier to entry of electrons from the electrode 323 to the photoelectric conversion unit 321, thereby suppressing a leaking current; however, it does not serve as a barrier to entry of holes generated in the photoelectric conversion unit 321, and thus the holes generated in the photoelectric conversion unit 321 are discharged to the electrode 323 through the electron barrier layer 322.

In addition, the light receiving and emitting device 20 can be configured by using p-type semiconductors and n-type semiconductors in an opposite manner to the case of FIG. 21.

In this case, in FIG. 21, the reading unit 300 has an n-type Si substrate as the Si substrate 301 and employs a p-type region of a p-type semiconductor for reading holes generated in the photoelectric conversion unit 321 as the Si substrate 302 (accumulation units) disposed on the Si substrate 301 in a lattice shape.

Furthermore, in FIG. 21, as the photoelectric conversion unit 321 disposed on the Si substrate 302 for which the p-type regions are employed, a direct-transition n-type semiconductor is employed.

In addition, in FIG. 21, a hole barrier layer composed of a material, for example, ZnO or the like which has transparency and serves as a barrier to entry of holes from the photoelectric conversion unit 321 is provided instead of the electron barrier layer 322.

As described above, in the light receiving and emitting device 20 in which the p-type semiconductors and n-type semiconductors are used in the opposite manner to the case of FIG. 21, when reverse bias is applied to the p-n junction of the photoelectric conversion unit 321 and the Si substrate 302, in other words, a higher voltage is applied to the n-type photoelectric conversion unit 321 than to the p-type Si substrate 302, holes among electrons and holes generated through photoelectric conversion of the photoelectric conversion unit 321 are quickly read on the Si substrate 302 side of the reading unit 300 due to the electric field caused by the reverse bias.

Here, in the light receiving and emitting device 20 in which the p-type semiconductors and n-type semiconductors are used in the opposite manner to the case of FIG. 21, the holes, rather than the electrons, among the electrons and holes generated through photoelectric conversion of the photoelectric conversion unit 321 are read as described above. Then, the holes are converted into a corresponding voltage, and then output as a pixel value.

Therefore, the photoelectric conversion unit 321 functions as a pixel which receives light and performs photoelectric conversion through which an electric signal corresponding to the amount of the light is output during application of reverse bias as well.

In addition, when forward bias is applied to the p-n junction of the photoelectric conversion unit 321 and the Si substrate 302, in other words, a lower voltage is applied to the n-type photoelectric conversion unit 321 than to the p-type Si substrate 302, holes are injected to the photoelectric conversion unit 321 from the Si substrate 302, and at the same time, electrons are injected from the electrode 323 to the photoelectric conversion unit 321 through the hole barrier layer that is provided instead of the electron barrier layer 322.

Due to injection of the electrons and holes, recombination of electrons and holes occurs in the photoelectric conversion unit 321, and thereby the photoelectric conversion unit 321 emits light.

Therefore, the photoelectric conversion unit 321 functions as a light emitting unit which emits light during application of forward bias as well.

As described above, also in the light receiving and emitting device 20 configured to use the p-type semiconductors and the n-type semiconductors in an opposite manner to the case of FIG. 21, the photoelectric conversion unit 321 can be caused to function as a pixel or a light emitting unit by merely changing the direction of bias applied to the p-n junction of the photoelectric conversion unit 321 and the Si substrate 302.

Figure 22:
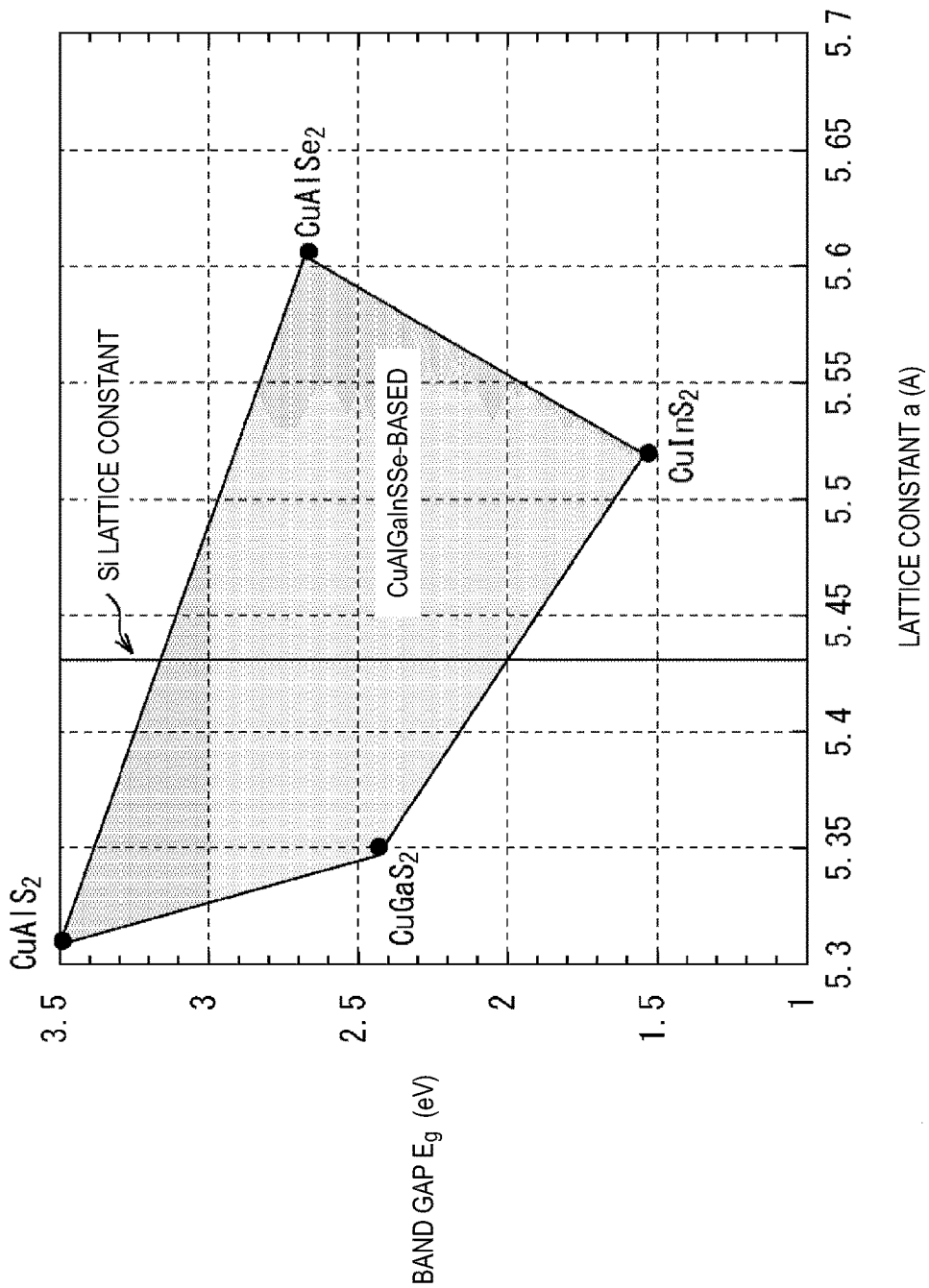
FIG. 22 is a diagram illustrating a relation between a lattice constant and a band cap.

FIG. 22 is a diagram illustrating a relation between a lattice constant and a band cap of a composition that can lattice-match Si.

A CuGaInS-based mixed crystal that forms the photoelectric conversion unit 321 of FIG. 21 is lattice-matched with the n-type Si substrate 302 as illustrated in FIG. 22.

Figure 23:
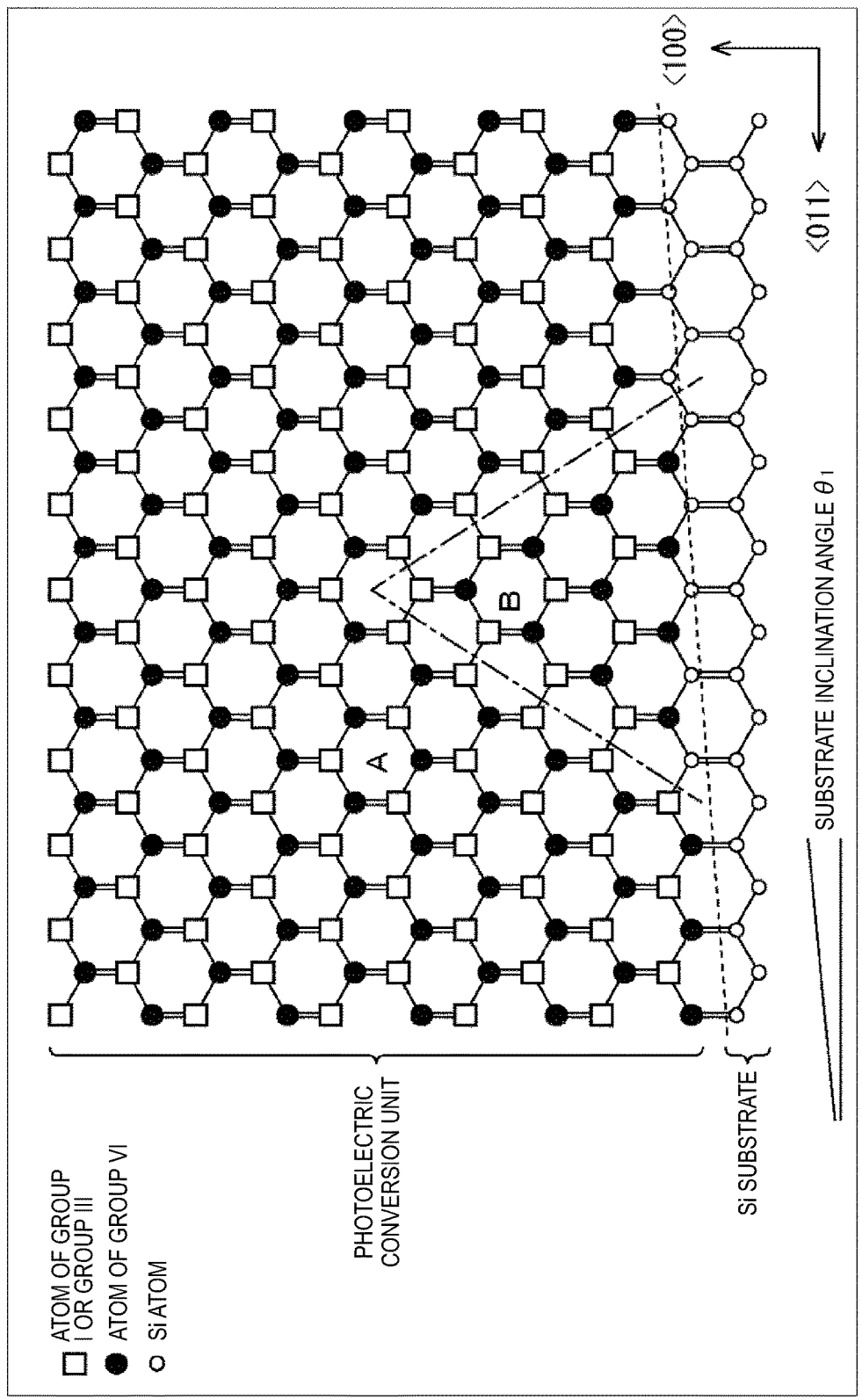
FIG. 23 is a diagram for describing crystal growth of a photoelectric conversion unit 321 formed on a Si substrate 302.

FIG. 23 is a diagram for describing crystal growth of the photoelectric conversion unit 321 formed on the Si substrate 302 of FIG. 21.

In crystal growth of the photoelectric conversion unit 321, as the Si substrate 302, a Si substrate that has Si(100) (Si whose Miller's index is (100)) and is inclined in the <011> direction as illustrated in FIG. 23 can be used.

Using the Si substrate 302, a region B that is an antiphase domain having a different crystal orientation from that of a region A of FIG. 23 in the photoelectric conversion unit 321 undergoes self-quenching by being closed in a triangular shape along with growth of a crystal that will serve as the photoelectric conversion unit 321, and thus the crystallinity improves.

It should be noted that, in FIG. 23, the Si substrate 302 is inclined by 6 degrees as indicated by the dashed line; however, the degree of inclination is not limited to 6 degrees, and any degree of inclination other than 6 degrees brings the effect of improvement in the crystallinity.

Using the inclined Si substrate 302 is useful in the MOCVD method, MBE method and any other arbitrary crystal growth method.

Figure 24:
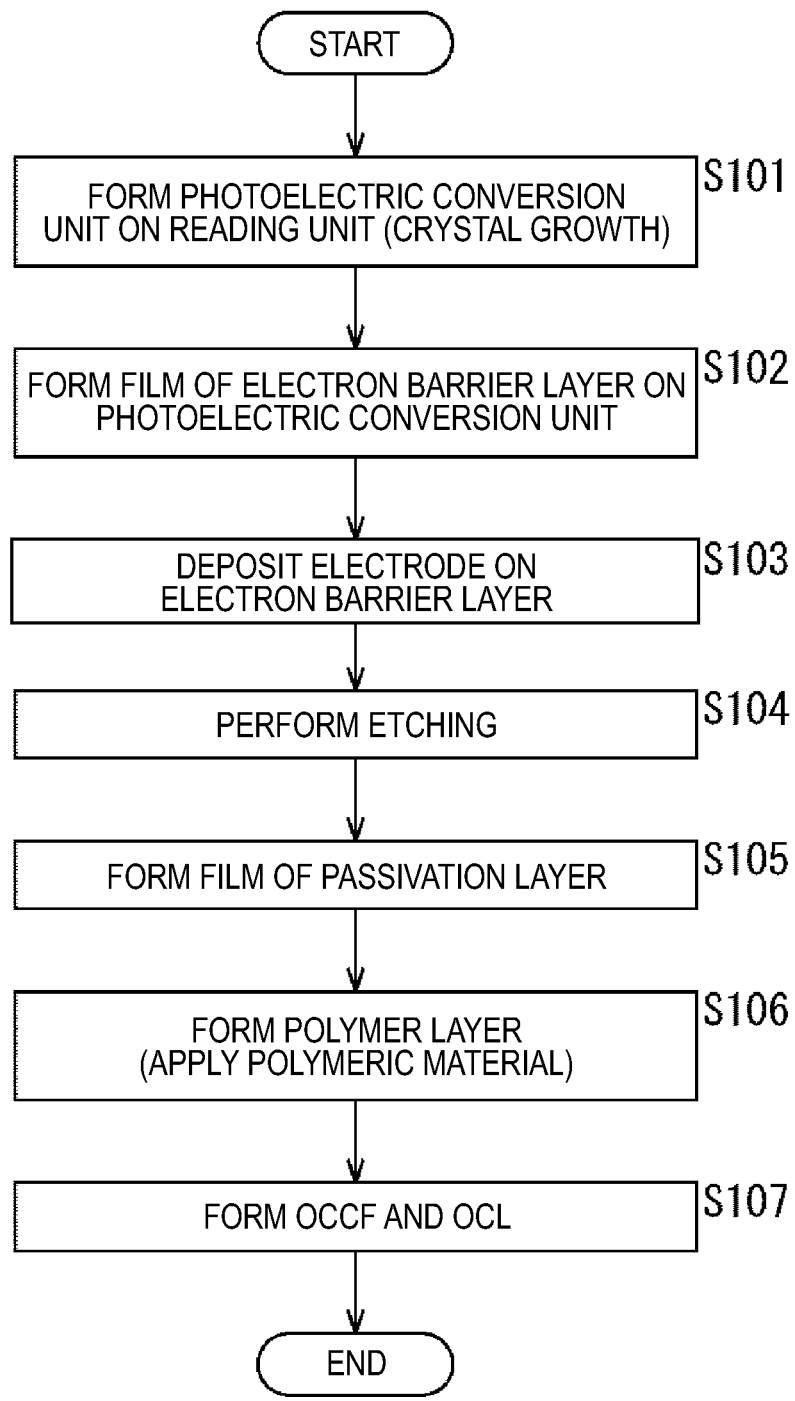
FIG. 24 is a flow chart describing an example of a manufacturing method of the light receiving and emitting device 20.

FIG. 24 is a flow chart describing an example of a manufacturing method of the light receiving and emitting device 20 of FIG. 21.

It should be noted that, in manufacturing of the light receiving and emitting device 20 of FIG. 21, the reading unit 300 is manufactured in advance in a semiconductor process.

In Step S101, the photoelectric conversion unit 321 is formed on the reading unit 300 through crystal growth using the MOCVD method, the MBE method, or the like.

In Step S102, the film of the electron barrier layer 322 of NiO is formed on the photoelectric conversion unit 321 using, for example, sputter vapor deposition.

Here, the film of the electron barrier layer 322 of NiO can be formed through vacuum vapor deposition or the like using, for example, an electron gun or laser ablation, rather than the sputter vapor deposition.

In addition, as the electron barrier layer 322, for example, $Cu_2O$, $ZnRh_2O_4$, or the like can be employed rather than NiO, and the film of the electron barrier layer 322 of $Cu_2O$, $ZnRh_2O_4$, or the like can be formed in the same manner as NiO.

In Step S103, ITO which will serve as the electrode 323 undergoes sputter vapor deposition on the electron barrier layer 322.

In Step S104, resists are selectively attached to the electrode 323 in the form of pixels (and light emitting units) using, for example, a lithography technology. Further, in reactive ion etching (RIE) processing, parts of the electrode 323 and electron barrier layer 322 are removed, and then the resists are removed.

In Step S105, the film of the passivation layer 324 of SiN is formed on the electrode 323 to cover the electrode 323, the electron barrier layer 322, and the photoelectric conversion unit 321 using, for example, a chemical vapor deposition (CVD) method.

Here, as the passivation layer 324, for example, SiNO, SiO, or the like can be employed, rather than SiN.

In Step S106, in order to flatten the surface, a polymer layer is formed on the passivation layer 324 by applying a polymeric material thereto in spin coating.

In Step S107, by selectively applying an OCCF material for each pixel (light emitting unit) using the lithography technology, the OCCF 326 is formed, and then the OCL 327 is formed on the OCCF 326 of the respective pixels in a general OCL process, and thereby the manufacturing of the light receiving and emitting device 20 is completed.

<Third Configuration Example of the Light Receiving and Emitting Device 20>

Figure 25:
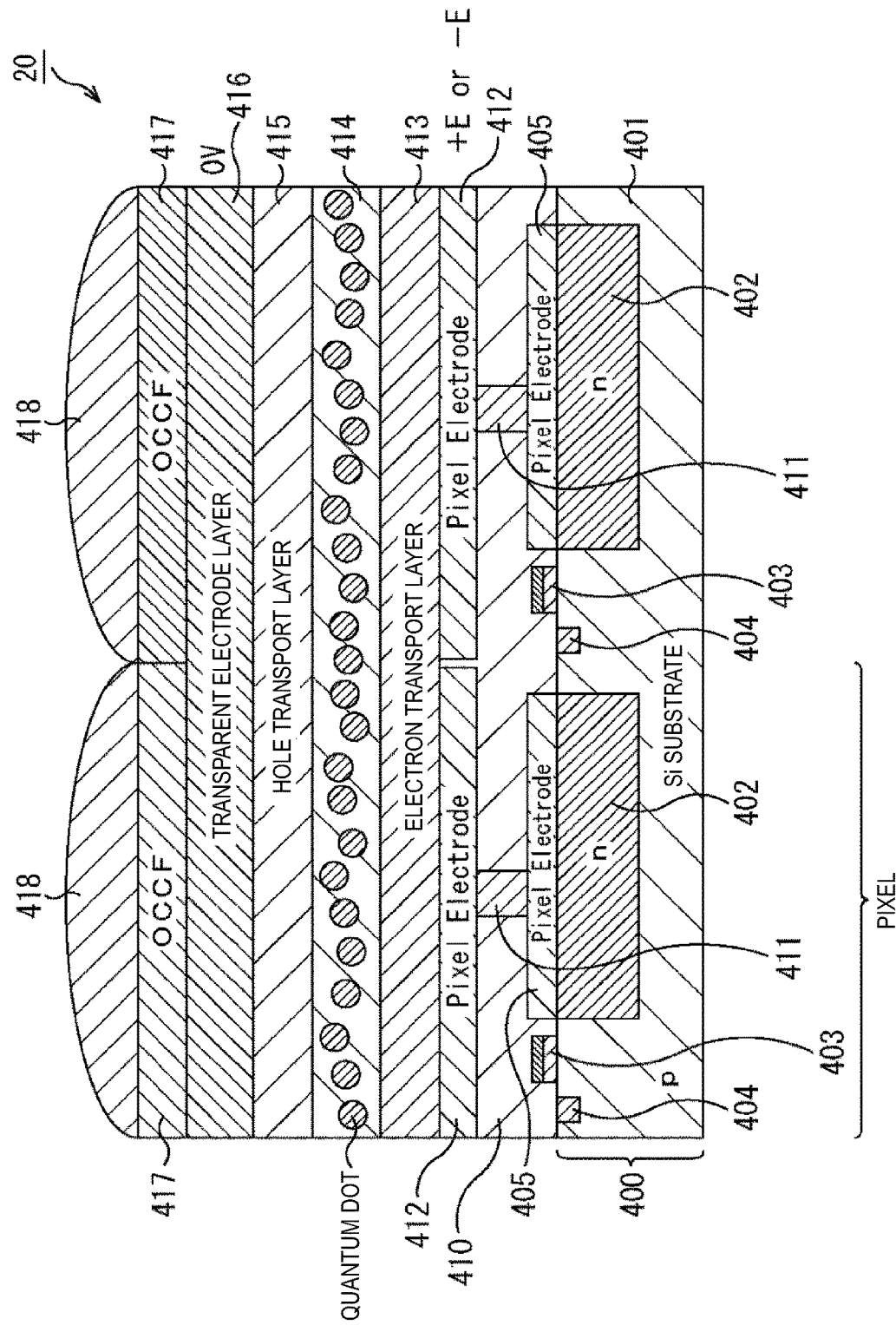
FIG. 25 is a cross-sectional diagram illustrating a third configuration example of the light receiving and emitting device 20 in detail.

FIG. 25 is a cross-sectional diagram illustrating a third configuration example of the light receiving and emitting device 20 of FIG. 1 in detail.

In the light receiving and emitting device 20 of FIG. 25, light emitting units which emit light and pixels which receive light are formed in an integrated manner as in the case of FIG. 21.

In FIG. 25, a reading unit 400 reads electrons (light) generated in light emitting photoelectric conversion unit 414 to be described later via an electron transport layer 413 which will also be described later, pixel electrodes (Pixel Electrode) 412, and metal plugs 411.

In other words, the reading unit 400 is constituted by a p-type Si substrate 401. A plurality of Si regions 402 which are n-type Si regions are disposed in the upper part inside the p-type Si substrate 401 in a lattice shape according to disposition of pixels.

The n-type Si regions 402 are n-type semiconductor regions for reading electrons generated in the light emitting photoelectric conversion unit 414, and the electrons generated in the light emitting photoelectric conversion unit 414 are accumulated therein.

In other words, metallic pixel electrodes 405 are formed on the Si regions 402. The electrons generated in the light emitting photoelectric conversion unit 414 are read by and accumulated in the Si regions 402 via the electron transport layer 413, the pixel electrodes 412, the metal plugs 411, and the pixel electrode 405.

n-type Si regions which serve as FDs 404 are formed on the left side of the n-type Si regions 402 in the upper part inside the p-type Si substrate 401.

In addition, MOS gates (transfer transistors) 403 are each provided between the Si region 402 and the FD 404 on the surface of the p-type Si substrate 401.

When the MOS gates 403 are on, the electrons accumulated in the Si regions 402 are transferred to the FDs 404.

The electric charges transferred to the FDs 404 are read via, for example, amplifying transistors and selection transistors, none of which is illustrated, converted into a corresponding voltage, and output as a pixel value.

The metal plugs 411 of which the periphery is filled with an oxide film 410 are disposed on the pixel electrodes 405 of the reading unit 400, and further, the pixel electrodes 412 which serve as the portion equivalent to pixels are disposed on the metal plugs 411.

In addition, the electron transport layer 413, the light emitting photoelectric conversion unit 414, a hole transport layer 415, a transparent electrode 416, OCCFs 417, and OCLs 418 are stacked in this order on the pixel electrodes 412.

Here, the electron transport layer 413 is configured with, for example, an n-type material or the like. The light emitting photoelectric conversion unit 414 is configured using, for example, quantum dots or an organic material. The hole transport layer 415 is configured with, for example, a p-type transparent material or the like. The transparent electrode 416 is configured with, for example, ITO, Al-doped ZnO, or the like.

In the light receiving and emitting device 20 of FIG. 25, when reverse bias is applied between the p-type hole transport layer 415 and the n-type electron transport layer 413, the light emitting photoelectric conversion unit 414 photoelectrically converts light incident through the OCLs 418, the OCCFs 417, the transparent electrode 416, and the hole transport layer 415.

Electrons (light)) obtained as a result of the photoelectric conversion by the light emitting photoelectric conversion unit 414 are read by the reading unit 400 via the electron transport layer 413 which transports the electrons, the pixel electrode 412 for helping the reading unit 400 to read the electrons, and the metal plugs 411.

Thus, the light emitting photoelectric conversion unit 414 functions as a pixel which receives light and performs photoelectric conversion that outputs an electric signal corresponding to the amount of light when reverse bias is applied.

In addition, when forward bias is applied between the p-type hole transport layer 415 and the n-type electron transport layer 413, holes are injected from the hole transport layer 415 which transports the holes and electrons are injected from the electron transport layer 413 which transports the electrons into the light emitting photoelectric conversion unit 414, and due to recombination of the holes and electrons, the light emitting photoelectric conversion unit 414 emits light.

Thus, the light emitting photoelectric conversion unit 414 functions as a light emitting unit which emits light when forward bias is applied.

Here, the application of forward bias or reverse bias between the p-type hole transport layer 415 and the n-type electron transport layer 413 can be performed by, for example, fixing the voltage of the transparent electrode 416 to 0 V, and applying a voltage of −E (<0) that is lower than 0 V or a voltage of +E (>0) that is higher than 0 V to the pixel electrodes 412 which serve as the portions equivalent to pixels.

By applying the voltage of +E to the pixel electrodes 412 that are equivalent to respective pixels, electrons that represent the pixel values of the respective pixels can be read, and by applying the voltage of −E to the pixel electrodes 412 that are equivalent to respective pixels, the respective pixels can be caused to independently emit light.

It should be noted that photoelectric conversion can be performed only in the light emitting photoelectric conversion unit 414 or also in the electron transport layer 413 or the hole transport layer 415 if a depletion layer is formed inside the electron transport layer 413 or the hole transport layer 415.

In addition, light emission can be performed not only in the light emitting photoelectric conversion unit 414 but also in the electron transport layer 413 or the hole transport layer 415 if recombination of holes and electrons occurs therein.

Figure 26:
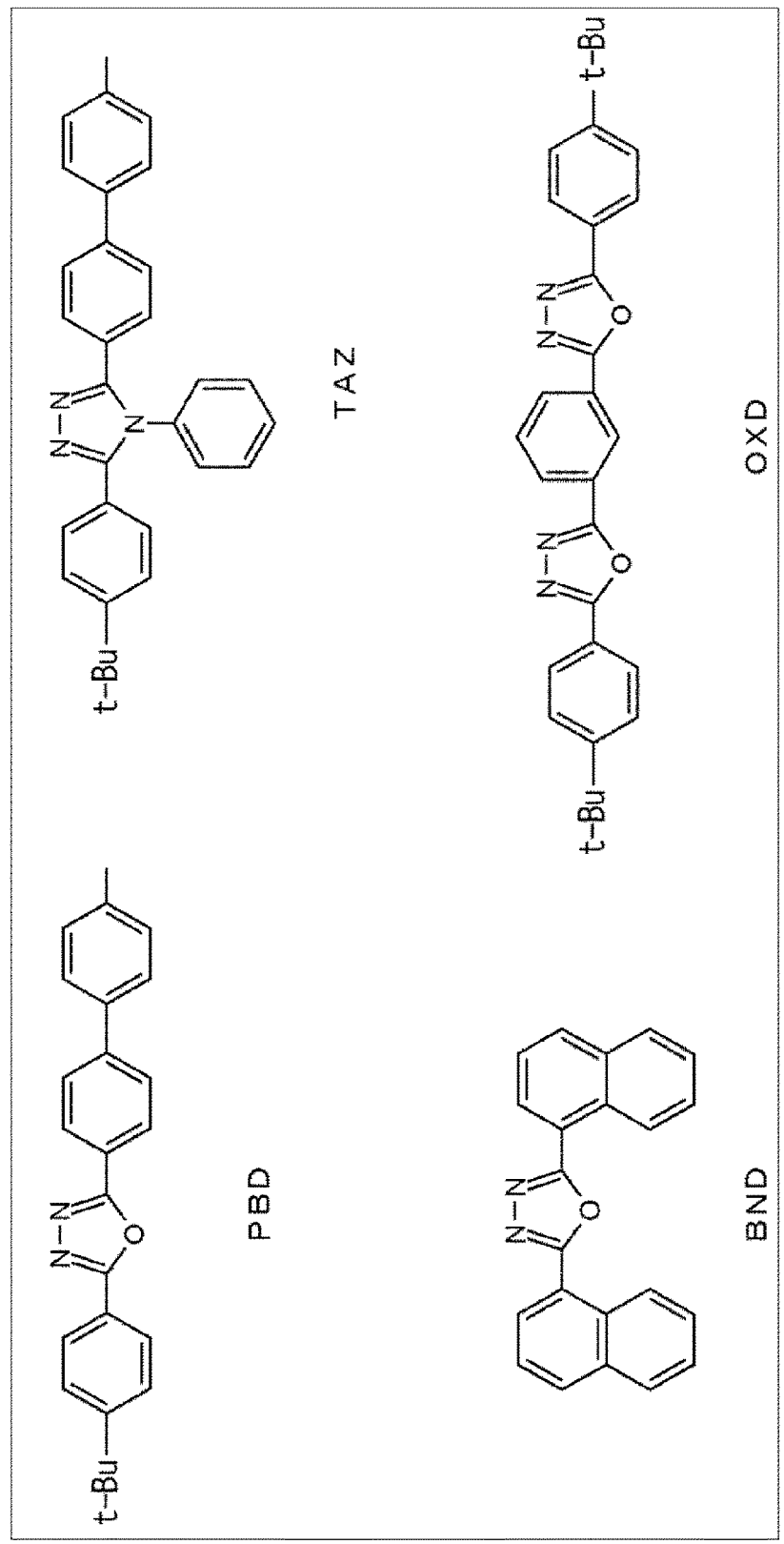
FIG. 26 is a diagram illustrating examples of materials composing an electron transport layer 413.

FIG. 26 is a diagram illustrating examples of materials composing the electron transport layer 413 of FIG. 25.

As the electron transport layer 413, for example, an organic EL material such as a metal complex (ALQ3) material, an oxadiazole (PBD)-based material, a triazole (TAZ)-based material, BND, or OXD, or an n-type inorganic material such as $TiO_2$ can be employed.

Figure 27:
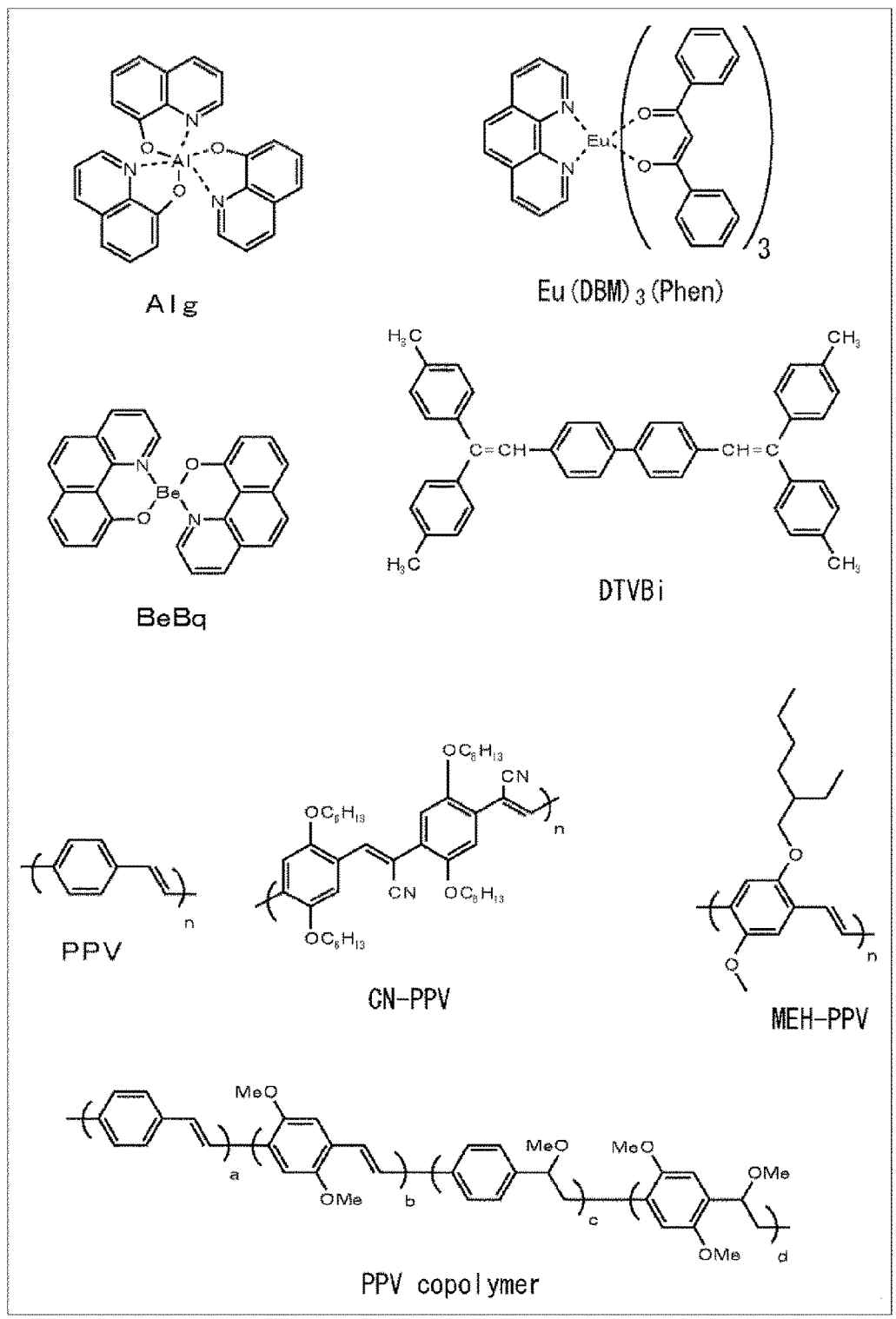
FIG. 27 is a diagram illustrating examples of materials composing a light emitting photoelectric conversion unit 414.

FIG. 27 is a diagram illustrating examples of materials composing the light emitting photoelectric conversion unit 414 of FIG. 25.

As the light emitting photoelectric conversion unit 414, for example, an organic material of a fluorescent or phosphorescent pigment compound can be employed. As low-molecular organic materials among such organic materials, there are a tris(8-quinolinolato)aluminum complex (Alq), a bis(benzo quinolinolato)beryllium complex (BeBq), a tri(dibenzoyl methyl)phenanthroline europium complex (Eu(DBM)3(Phen)), ditolyl vinyl biphenyl (DTVBi), and the like, and as polymeric organic materials, there are π-conjugated polymers such as fluorescent poly(p-phenylenevinylene), poly alkyl thiophenes, and the like. In the polymers, the electron transport property can be controlled due to introduction of a substituent, and various polymers having the hole transport property to the electron transport property are synthesized.

In addition, as a polymer that is the material of the light emitting photoelectric conversion unit 414, there is, for example, a poly(p-phenylenevinylene) derivative, or the like. When the poly derivative is used as the light emitting photoelectric conversion unit 414, direct-transition-type semiconductor quantum dots of, for example, CdSe, CdS, InP, ZnSe, ZnTe, GaAs, or the like may be inserted into the poly derivative. In addition, instead of the pigment compound, a substance obtained by inserting quantum dots into the material forming the electron transport layer 413 (electron transport material) can be employed as the light emitting photoelectric conversion unit 414. With the light emitting photoelectric conversion unit 414 that employs the material into which the quantum dots are inserted, high quantum efficiency of light emission and reception can be obtained.

Figure 28:
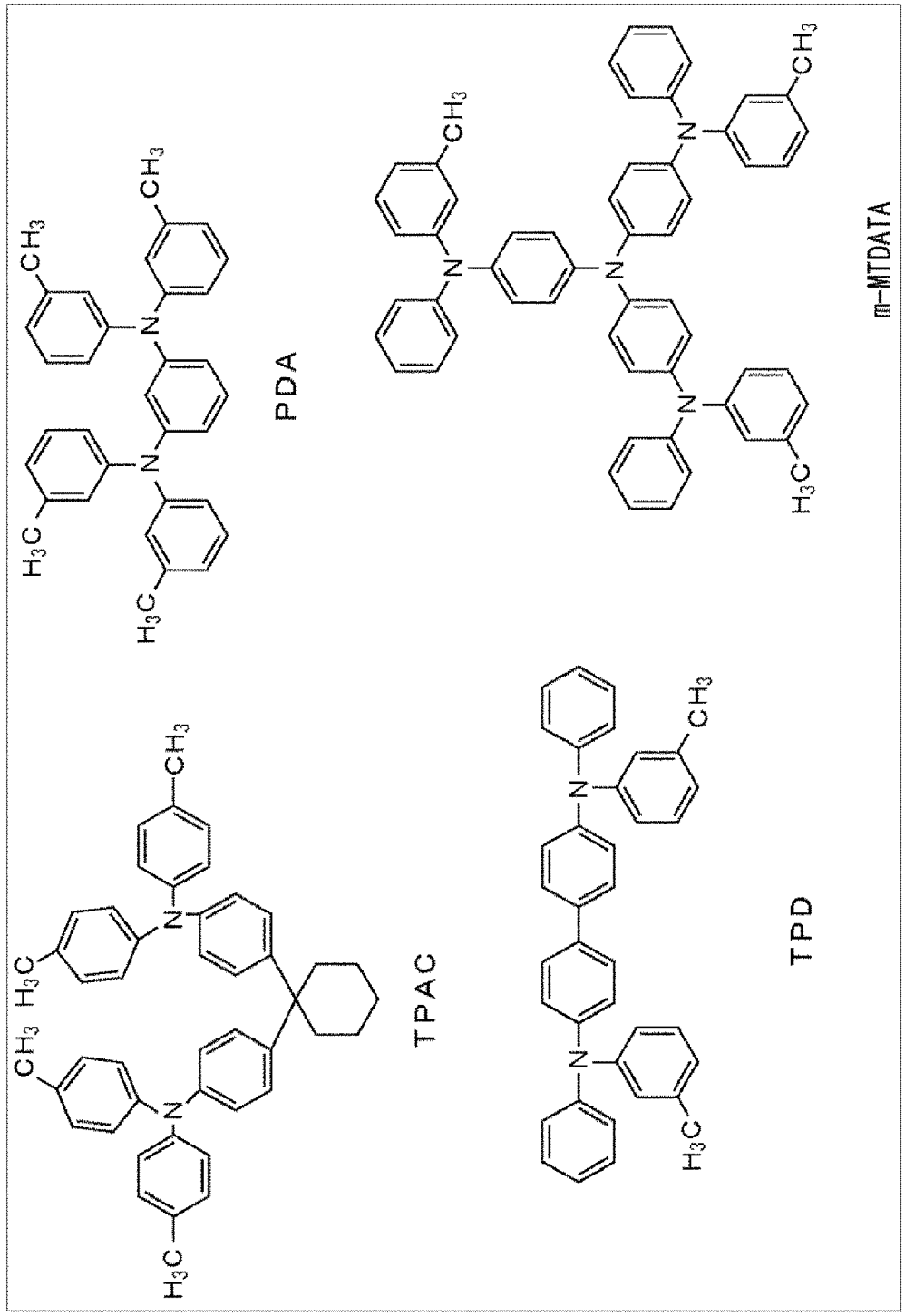
FIG. 28 is a diagram illustrating examples of materials composing a hole transport layer 415.

FIG. 28 is a diagram illustrating examples of materials composing the hole transport layer 415 of FIG. 25.

As the hole transport layer 415, for example, an organic EL material that is an aromatic amine compound such as TPAC, PDA, TPD, or m-MTDATA, or an inorganic material such as a p-type NiO can be employed.

Here, in the light receiving and emitting device 20 of FIG. 25, the electron transport layer 413, the light emitting photoelectric conversion unit 414, and the hole transport layer 415 which use organic materials can be formed, for example, through vacuum vapor deposition or application or using a printing technology.

In addition, the transparent electrode 416, and the electron transport layer 413, the light emitting photoelectric conversion unit 414, and the hole transport layer 415 which use inorganic materials can be formed using, for example, a sputtering method.

Furthermore, the light emitting photoelectric conversion unit 414 into which quantum dots are inserted is easily produced particularly when the quantum dots are mixed with a polymeric organic material and then applied.

It should be noted that, in the light receiving and emitting device 20 of the metal plug structure in which the metal plugs 411 are used as illustrated in FIG. 25, the electron transport layer 413, the light emitting photoelectric conversion unit 414, and the hole transport layer 415 can be configured using semiconductor materials as well as organic EL materials and the like described above.

In other words, as the electron transport layer 413, for example, an n-type semiconductor such as Se-doped AlGaAs can be employed. As the hole transport layer 415, for example, a p-type semiconductor such as Zn-doped AlGaAs can be employed.

As the light emitting photoelectric conversion unit 414, a semiconductor having a narrower band gap than the electron transport layer 413 and the hole transport layer 415 can be employed. For example, when Se-doped AlGaAs is employed as the electron transport layer 413 and Zn-doped AlGaAs is employed as the hole transport layer 415, a semiconductor of GaAs or the like, for example, can be employed as the light emitting photoelectric conversion unit 414.

Figure 29:
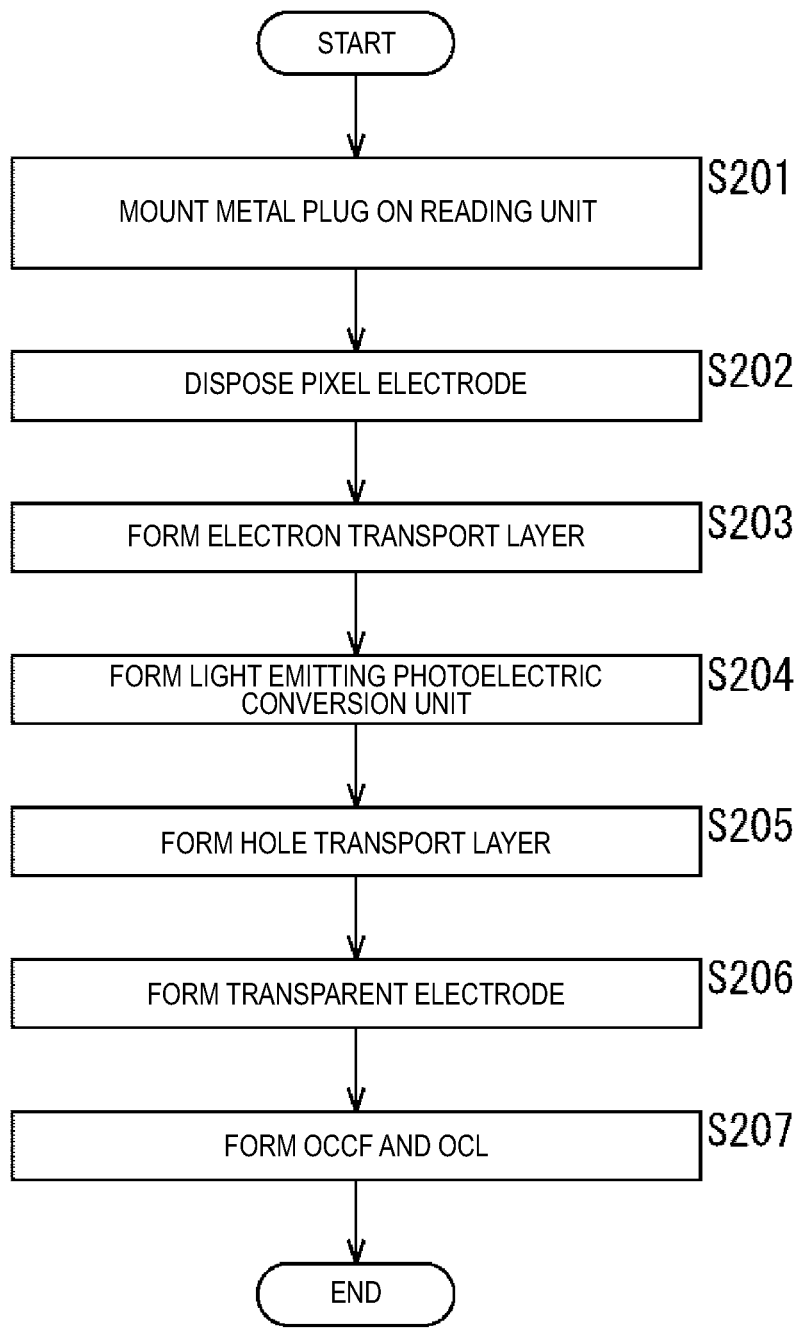
FIG. 29 is flow chart describing an example of a manufacturing method of the light receiving and emitting device 20.

FIG. 29 is flow chart describing an example of a manufacturing method of the light receiving and emitting device 20 of FIG. 25.

It should be noted that, in manufacturing of the light receiving and emitting device 20 of FIG. 25, the reading unit 400 is manufactured in advance in the semiconductor process.

In Step S201, the metal plugs 411 are mounted on the pixel electrodes 405 of the reading unit 400, and then the oxide film 410 is formed.

In Step S202, the pixel electrodes 412 are disposed, and in Step S203, the electron transport layer 413 is formed.

In Step S204, the light emitting photoelectric conversion unit 414 is formed, and in Step S205 the hole transport layer 415 is formed.

In Step S206, the transparent electrode 416 is formed, and in Step S207, the OCCFs 417 and the OCLs 418 are formed, and thereby manufacturing of the light receiving and emitting device 20 is completed.

Here, in the present specification, a system means a set of a plurality of constituent elements (devices, modules (components), and the like) regardless of whether all of the constituent elements are in the same housing. Thus, a plurality of devices which are accommodated in separate housings and connected through a network, and one device in which a plurality of modules are accommodated in one housing are all systems.

In addition, an embodiment of the present technology is not limited to the above-described embodiments, and can be variously modified within the scope not departing from the gist of the present technology.

Additionally, the present technology may also be configured as below.

<1>
A light receiving and emitting device including:
a light receiving and emitting unit configured to have
  a plurality of pixels that receive light and perform photoelectric conversion through which an electric signal corresponding to an amount of the light is output and
  a plurality of light emitting units that emit light, the two or more light emitting units being disposed for every two or more pixels;
an imaging optical system configured to form an image on the pixels of the light receiving and emitting unit; and
a control unit configured to independently control light emission of the plurality of respective light emitting units.

<2>
The light receiving and emitting device according to <1>, wherein the control unit recognizes an image captured through photoelectric conversion of the plurality of pixels and causes the light emitting units to emit light on the basis of a result of the recognition of the image.

<3>
The light receiving and emitting device according to <1> or <2>, wherein the pixels and the light emitting units are formed in an integrated manner.

<4>
The light receiving and emitting device according to <3>, wherein the light receiving and emitting unit includes:
a reading unit constituted by a substrate that has an n-type region of an n-type semiconductor for reading electrons;
a photoelectric conversion unit that is a direct-transition-type p-semiconductor disposed on the n-type region to perform photoelectric conversion;
a transparent electron barrier layer that is disposed on the photoelectric conversion unit to serve as a barrier of the electrons; and
a transparent electrode that is disposed on the electron barrier layer, or includes
a reading unit constituted by a substrate that has a p-type region of a p-type semiconductor for reading holes;
a photoelectric conversion unit that is a direct-transition-type n-type semiconductor disposed on the p-type region to perform photoelectric conversion;
a transparent hole barrier layer that is disposed on the photoelectric conversion unit to serve as a barrier of the holes; and
a transparent electrode that is disposed on the hole barrier layer, and
wherein the photoelectric conversion unit
  functions as the pixels when reverse bias is applied to a p-n junction of the photoelectric conversion unit and the n-type region or the p-type region, and
  functions as the light emitting units when forward bias is applied to the p-n junction of the photoelectric conversion unit and the n-type region or the p-type region.

<5>
The light receiving and emitting device according to <3>, wherein the light receiving and emitting unit includes:
a reading unit configured to read electrons;
a pixel electrode configured to help the reading unit to read the electrons;
an electron transport layer that is disposed on the pixel electrode to transport the electrons;
a light emitting photoelectric conversion unit that is disposed on the electron transport layer to emit light and perform photoelectric conversion;
a hole transport layer that is disposed on the light emitting photoelectric conversion unit to transport holes; and
a transparent electrode configured on the hole transport layer, and
wherein the light emitting photoelectric conversion unit
  functions as the pixels when a higher electrode is applied to the pixel electrode than to the transparent electrode, and
  functions as the light emitting units when a lower electrode is applied to the pixel electrode than to the transparent electrode.

<6>
The light receiving and emitting device according to <2>, wherein the light receiving and emitting unit includes:
an image sensor unit configured with photo diodes (PDs) serving as the pixels; and
the light emitting units that are disposed between the PDs of the image sensor unit and that has a double heterostructure or a structure of a multilayer reflector.

<7>
The light receiving and emitting device according to <6>, wherein the light emitting units which have the double heterostructure or the structure of a multilayer reflector each have a lower electrode that is an electrode in a lower part which is a side on which the light emitting units face the image sensor unit, and
wherein the lower electrode also serves as a light blocking film.

<8>
The light receiving and emitting device according to <1>, <2>, <6>, or <7>, wherein M number of light emitting units are disposed for every N number of pixels, M being greater than or equal to two, N being greater than M and greater than or equal to two.

<9>
The light receiving and emitting device according to <1>, <2>, <6>, or <7>, wherein two or more light emitting units are disposed for the same number of pixels as the number that is greater than or equal to two of the light emitting units.

<10>
The light receiving and emitting device according to <1>, <2>, <6>, or <7>, wherein the number of the light emitting units disposed for every two or more pixels is different according to a disposed position.

<11>
The light receiving and emitting device according to <1>, wherein the control unit controls light emission of the light emitting units to cause light to be radiated to a desired position.

<12>
The light receiving and emitting device according to <1> or <11>, wherein the control unit controls light emission of the light emitting units and controls capturing of an image through photoelectric conversion of the plurality of pixels, and thereby the capturing and the light emission are performed at different timings.

<13>

The light receiving and emitting device according to <1>, <11>, or <12>, wherein the light emitting units are disposed for every one or more pixels on the side on which light is incident on the pixels.

<14>

The light receiving and emitting device according to <1>, <11>, or <12>, wherein the pixels and the light emitting units are formed in an integrated manner, and function as the pixels or the light emitting units according to a direction in which bias is applied.

<15>

The light receiving and emitting device according to any one of <1> and <11> to <14>, wherein each of the light emitting units is formed of a group III-V, group II-VI, or group I-III-VI compound, or a compound semiconductor material containing quantum dots or a quantum well of the group III-V, group II-VI, or group I-III-VI compound.

<16>

The light receiving and emitting device according to any one of <1> and <11> to <14>, wherein each of the light emitting units is formed of an organic material.

<17>

The light receiving and emitting device according to any one of <1> and <11> to <16>, wherein the control unit transmits information by causing the light emitting units corresponding to a specific position of an image captured through photoelectric conversion of the plurality of pixels to emit light.

<18>

The light receiving and emitting device according to <17>, wherein the control unit receives information by causing the pixels corresponding to the specific position to receive light.

<19>

The light receiving and emitting device according to <18>, wherein the control unit transmits information to a plurality of respective devices by causing the light emitting units corresponding to a plurality of respective specific positions of the image captured through the photoelectric conversion of the plurality of pixels to emit light, and receives information from the plurality of respective devices by causing the pixels corresponding to the plurality of respective specific positions to receive light.

<20>

The light receiving and emitting device according to <18>, further including:

another light emitting unit configured to transmit identification information for identifying a communication partner by emitting light, wherein the control unit starts exchange of information with another device after the another device is identified based on the identification information from the another device.<21>

The light receiving and emitting device according to any one of <17> to <19> which is a mobile terminal that functions as a communication device which exchanges information using light or as an imaging device which captures an image.

<22>

The light receiving and emitting device according to any one of <11> to <16>, wherein the control unit controls light emission of the light emitting units to cause light to be radiated to a specific position of an organ, and wherein a medical endoscope for performing an examination or treatment of the specific position.

<23> The light receiving and emitting device according to <22>, wherein the control unit controls light emission of the light emitting units to cause light to be radiated to the specific position of the organ that is recognized from an image captured through photoelectric conversion of the plurality of pixels.

<24> The light receiving and emitting device according to <23>, wherein the plurality of pixels perform photoelectric conversion of light received through an optical fiber, and thereby an image of the organ is captured.

<25> The light receiving and emitting device according to <23> or <24>, wherein the organ is lit by light emission of a predetermined lighting device or by some or all of the plurality of light emitting units to capture an image of the organ.

<26> The light receiving and emitting device according to <22>, wherein the optical spectrum of reflected light, scattered light, fluorescent light, or phosphorescent light from the specific position which is obtained by radiating light to the specific position of the organ is acquired.

<27> The light receiving and emitting device according to <26>, wherein the optical spectrum of fluorescent light or phosphorescent light emitted by a marker of the specific position obtained by radiating light to the specific position of the organ is acquired.

<28> The light receiving and emitting device according to <22>, wherein the control unit scans a radiation position of light by causing some or all of the plurality of light emitting units to sequentially emit light.

REFERENCE SIGNS LIST 10 imaging optical system
11 imaging lens
12 diaphragm
20 light receiving and emitting device
30 image sensor unit
31 pixel
32 color filter
41 light emitting unit
51 imaging and light emitting device
52 control device
60, 61 mobile terminal
61A imaging and light emitting device
62 mobile terminal
62A imaging and light emitting device
63 mobile terminal
63A imaging and light emitting device
71 light emitting device
91 optical fiber
92 spectroscope
93 optical fiber
94 lighting device
95 optical fiber 96 imaging lens
100 image sensor unit
101 Si substrate
102 n-Si small region
103 FD
104 transistor
110 oxide film
111 wiring layer
120 light emitting unit
121 p-compound semiconductor
122 n-compound semiconductor
123 lower electrode
124 light emitting layer
125 layer
126 contact layer
127 layer
128 contact layer
129 upper electrode
151 substrate
152, 153 multilayer reflector
154 resonator
155 upper electrode
201 hydrogen cylinder
202 valve
203 hydrogen purifier
$204_1$ to $204_4$ MFC
$205_1$ to $205_4$ organic metal raw material tank
$206_1$ to $206_4$, $207_1$ to $207_4$ valve
208 gas raw material cylinder
209 MFC
210, 211 valve
212 MFC
221 reaction tube
222 susceptor
223 substrate
224 RF coil
241 chamber
242 substrate holder
243 substrate
$244_1$ to $244_3$ Knudsen cell
245 RHEED electron gun
246 fluorescent screen
247 QMS
248 plasma cell
300 reading unit
301, 302 Si substrate
303 Si region
304 vertical transistor
305 Si region
306 vertical transistor
307 MOS gate
308 FD
309 MOS gate
310 Si region
321 photoelectric conversion unit
322 electron barrier layer
323 electrode
324 passivation layer
325 polymer layer
326 OCCF
327 OCL
400 reading unit
401 Si substrate
402 Si region
403 MOS gate
404 FD
405 pixel electrode
410 oxide film
411 metal plug
412 pixel electrode
413 electron transport layer
414 light emitting photoelectric conversion unit
415 hole transport layer
416 transparent electrode
417 OCCF
418 OCL

The invention claimed is:

1. A light receiving and emitting device, comprising:
a light receiving and emitting unit that comprises:
a plurality of pixels configured to:
receive first light, and
output an electric signal corresponding to an amount of the first light, based on photoelectric conversion; and
a plurality of light emitting units configured to emit second light, wherein an entirety of at least one light emitting unit of the plurality of light emitting units is on at least two pixels of the plurality of pixels in a light incident direction,
wherein a first number of light emitting units of the plurality of light emitting units is present for a second number of pixels of the plurality of pixels, and
wherein the first number is greater than or equal to two, and the second number is greater than the first number;
an imaging optical system configured to generate a first image on the plurality of pixels; and
a control unit configured to control the emission of the second light of each of the plurality of light emitting units.

2. The light receiving and emitting device according to claim 1, wherein the control unit is further configured to recognize a second image captured based on the photoelectric conversion, and wherein the control of the emission of the second light is based on the recognition of the second image.

3. The light receiving and emitting device according to claim 2, wherein the plurality of pixels is integrated with the plurality of light emitting units.

4. The light receiving and emitting device according to claim 3, wherein the light receiving and emitting unit further includes one of:
a first reading unit that comprises a first substrate, wherein the first reading unit is configured to read electrons, wherein the first substrate comprises an n-type region, and wherein the n-type region comprises an n-type semiconductor;
a first photoelectric conversion unit that comprises a direct-transition-type p-type semiconductor on the n-type region,
wherein the first photoelectric conversion unit is configured to:
perform the photoelectric conversion,
function as the plurality of pixels, based on a first reverse bias voltage applied to a p-n junction of the first photoelectric conversion unit and the n-type region, and
function as the plurality of light emitting units based on a first forward bias voltage applied to the p-n junction of the first photoelectric conversion unit and the n-type region;

a transparent electron barrier layer on the first photoelectric conversion unit, wherein the transparent electron barrier layer is configured to serve as a barrier for the electrons; and
a first transparent electrode on the transparent electron barrier layer,
or
a second reading unit that comprises a second substrate, wherein the second substrate is configured to read holes, wherein the second substrate comprises a p-type region, and wherein the p-type region comprises a p-type semiconductor;
a second photoelectric conversion unit that comprises a direct-transition-type n-type semiconductor on the p-type region,
wherein the second photoelectric conversion unit is configured to:
perform the photoelectric conversion,
function as the plurality of pixels, based on a second reverse bias voltage applied to a p-n junction of the second photoelectric conversion unit and the p-type region, and
function as the plurality of light emitting units, based on a second forward bias voltage applied to the p-n junction of the second photoelectric conversion unit and the p-type region;
a transparent hole barrier layer on the second photoelectric conversion unit, wherein the transparent hole barrier layer is configured to serve as a barrier for the holes; and
a second transparent electrode on the transparent hole barrier layer.

5. The light receiving and emitting device according to claim 3, wherein the light receiving and emitting unit further includes:
a pixel electrode;
a reading unit configured to read electrons via the pixel electrode;
an electron transport layer on the pixel electrode, wherein the electron transport layer is configured to transport the electrons;
a light emitting photoelectric conversion unit on the electron transport layer;
a hole transport layer on the light emitting photoelectric conversion unit, wherein the hole transport layer is configured to transport holes; and
a transparent electrode on the hole transport layer,
wherein the light emitting photoelectric conversion unit is configured to:
function as the plurality of pixels, when a first voltage applied to the pixel electrode is greater than a second voltage applied to the transparent electrode, and
function as the plurality of light emitting units, based on the first voltage that is less than the second voltage.

6. The light receiving and emitting device according to claim 2, wherein the light receiving and emitting unit further includes:
an image sensor unit that comprises photo diodes (PDs), wherein the PDs serve as the plurality of pixels,
wherein the at least one light emitting unit of the plurality of light emitting units overlaps a first photo diode of the PDs and a second photo diode of the PDs, and wherein the plurality of light emitting units have one of a double heterostructure or a structure of a multilayer reflector.

7. The light receiving and emitting device according to claim 6, wherein each of the plurality of light emitting units comprises an electrode, wherein the electrode is at a side of each of the plurality of light emitting units, wherein the side faces the image sensor unit, and wherein the electrode is configured to serve as a light blocking film.

8. The light receiving and emitting device according to claim 2, wherein the first number of the plurality of light emitting units varies based on a position of the plurality of light emitting units.

9. The light receiving and emitting device according to claim 1, wherein the control unit is further configured to:
control a capture of a second image, wherein the second image is captured at a first time based on the photoelectric conversion; and
control the plurality of light emitting units to emit the second light at a second time.

10. The light receiving and emitting device according to claim 1, wherein the plurality of pixels is integrated with the plurality of light emitting units, and wherein the output of the electric signal and the emission of the second light are based on a direction in which a bias voltage is applied to the plurality of pixels integrated with the plurality of light emitting units.

11. The light receiving and emitting device according to claim 1, wherein each of the plurality of light emitting units comprises one of a group III-V compound, a group II-VI compound, a group I-III-VI compound, or a compound semiconductor material containing one of quantum dots, or a quantum well of one of the group III-V compound, the group II-VI compound, or the group I-III-VI compound.

12. The light receiving and emitting device according to claim 1, wherein each of the plurality of light emitting units comprises an organic material.

13. The light receiving and emitting device according to claim 1, wherein the control unit is configured to transmit first information, based on the emission of the second light by the plurality of light emitting units, and wherein the plurality of light emitting units corresponds to a specific position of a second image captured based on the photoelectric conversion.

14. The light receiving and emitting device according to claim 13, wherein the control unit is further configured to receive second information based on the reception of the first light by the plurality of pixels, and wherein the plurality of pixels corresponds to the specific position.

15. The light receiving and emitting device according to claim 14, wherein the control unit is further configured to:
transmit third information to a plurality of devices, based on the emission of the second light by the plurality of light emitting units, wherein the plurality of light emitting units corresponds to a plurality of specific positions of the second image captured based on the photoelectric conversion, and
receive fourth information from the plurality of devices, based on the reception of the first light by the plurality of pixels, wherein the plurality of pixels corresponds to the plurality of specific positions.

16. The light receiving and emitting device according to claim 14, further comprising:
a light emitting unit, different from the plurality of light emitting units, configured to transmit identification information, wherein the control unit is further configured to exchange third information with a device, based on the device identified based on the identification information.

17. A light receiving and emitting device, comprising:
a light receiving and emitting unit that comprises:
- a plurality of pixels configured to:
  - receive first light, and
  - output an electric signal corresponding to an amount of the first light, based on photoelectric conversion;
- a plurality of light emitting units configured to emit second light, wherein an entirety of at least one light emitting unit of the plurality of light emitting units is on at least two pixels of the plurality of pixels in a light incident direction,
  - wherein a first number of light emitting units of the plurality of light emitting units is present for a second number of pixels of the plurality of pixels, and
  - wherein the first number is greater than or equal to two and the second number is greater than the first number; and
- an image sensor unit that comprises photo diodes (PDs), wherein the PDs constitute the plurality of pixels, and wherein the plurality of light emitting units has one of a double heterostructure or a structure of a multilayer reflector;

an imaging optical system configured to generate a first image on the plurality of pixels; and
a control unit configured to control the emission of the second light of each of the plurality of light emitting units.

18. A light receiving and emitting device, comprising:
a light receiving and emitting unit that comprises:
- a plurality of pixels configured to:
  - receive first light, and
  - output an electric signal corresponding to an amount of the first light, based on photoelectric conversion, and
- a plurality of light emitting units configured to emit second light,
- wherein a first number of light emitting units of the plurality of light emitting units is present for a second number of pixels of the plurality of pixels,
- wherein the first number is greater than or equal to two and the second number is greater than the first number, and
- wherein the plurality of pixels is integrated with the plurality of light emitting units, and wherein the output of the electric signal and the emission of the second light are based on a direction in which a bias voltage is applied to the plurality of pixels integrated with the plurality of light emitting units;

an imaging optical system configured to generate a first image on the plurality of pixels; and
a control unit configured to control the emission of the second light of each of the plurality of light emitting units.

* * * * *